US012610645B2

(12) United States Patent
Hayashi et al.

(10) Patent No.: US 12,610,645 B2
(45) Date of Patent: Apr. 21, 2026

(54) PHOTOELECTRIC CONVERSION DEVICE, IMAGING SYSTEM, AND MOVABLE BODY

(71) Applicant: CANON KABUSHIKI KAISHA, Tokyo (JP)

(72) Inventors: Hideki Hayashi, Kanagawa (JP); Kazuhiro Morimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 340 days.

(21) Appl. No.: 18/329,921

(22) Filed: Jun. 6, 2023

(65) Prior Publication Data

US 2023/0395630 A1    Dec. 7, 2023

(30) Foreign Application Priority Data

Jun. 7, 2022    (JP) ................................. 2022-092372

(51) Int. Cl.
  *H10F 39/00* (2025.01)
  *G06T 7/521* (2017.01)
(52) U.S. Cl.
  CPC ........... *H10F 39/807* (2025.01); *G06T 7/521* (2017.01); *G06T 2207/10028* (2013.01); *G06T 2207/30252* (2013.01)
(58) Field of Classification Search
  CPC .. H10F 39/807; H10F 39/199; H10F 39/8063; H10F 39/8067; G06T 7/521; G06T 2207/10028; G06T 2207/30252
  See application file for complete search history.

(56) References Cited

U.S. PATENT DOCUMENTS

| 2019/0165026 A1* | 5/2019 | Kuo ....................... H10F 39/807 |
| 2023/0126548 A1* | 4/2023 | Okazaki ................ H10F 39/807 |
| | | 257/230 |
| 2023/0143614 A1* | 5/2023 | Oshiyama ............. H10F 39/807 |
| | | 257/432 |
| 2024/0170518 A1* | 5/2024 | Takatsuka ........... H10F 39/8063 |

FOREIGN PATENT DOCUMENTS

| JP | 2021027276 A | 2/2021 | |
| JP | 2021048241 A | 3/2021 | |
| JP | 2021061330 A | 4/2021 | |
| JP | 2022023393 A | 2/2022 | |
| WO | 2020085115 A1 | 4/2020 | |
| WO | WO-2022196141 A1 * | 9/2022 | ............ H10F 39/811 |

* cited by examiner

*Primary Examiner* — S M Sohel Imtiaz
(74) *Attorney, Agent, or Firm* — Canon U.S.A., Inc. IP Division

(57) ABSTRACT

A photoelectric conversion device includes a pixel isolation portion and a concavo-convex structure. The pixel isolation portion is arranged between adjacent pixels in a plurality of pixels formed in a semiconductor layer. The concavo-convex structure is formed on a light receiving surface of the semiconductor layer. The concavo-convex structure includes a trench extending toward an oblique direction from the light receiving surface to an inside of the semiconductor layer. The trench is filled with material that is different from material of the semiconductor layer positioned around the trench.

20 Claims, 42 Drawing Sheets

Figure 31:
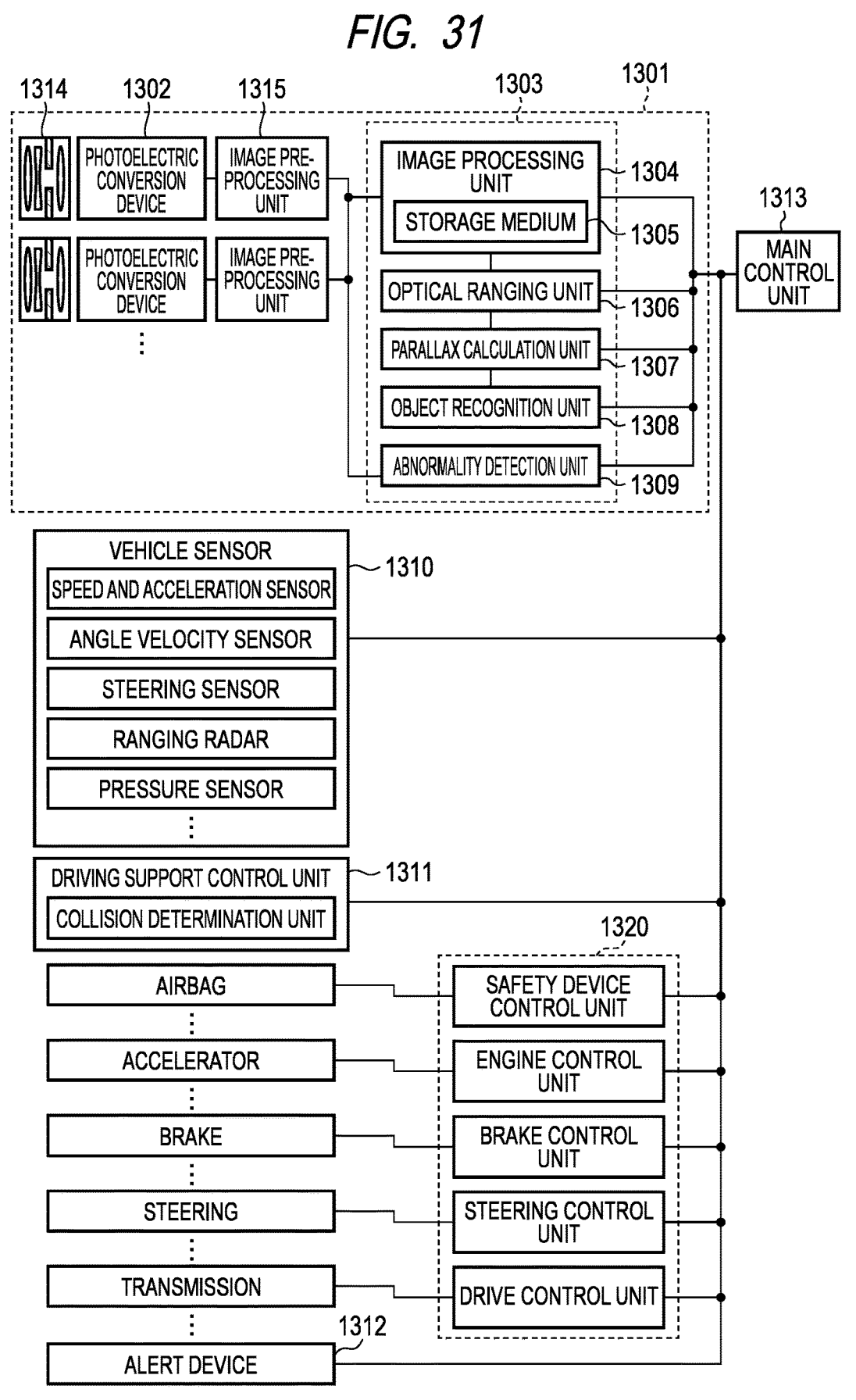

PHOTOELECTRIC CONVERSION DEVICE

IMAGE PRE-PROCESSING UNIT

PHOTOELECTRIC CONVERSION DEVICE

IMAGE PRE-PROCESSING UNIT

IMAGE PROCESSING UNIT ～ 1304

STORAGE MEDIUM ～ 1305

OPTICAL RANGING UNIT ～ 1306

PARALLAX CALCULATION UNIT ～ 1307

OBJECT RECOGNITION UNIT ～ 1308

ABNORMALITY DETECTION UNIT ～ 1309

1313

MAIN CONTROL UNIT

VEHICLE SENSOR ～ 1310

SPEED AND ACCELERATION SENSOR

ANGLE VELOCITY SENSOR

STEERING SENSOR

RANGING RADAR

PRESSURE SENSOR

DRIVING SUPPORT CONTROL UNIT ～ 1311

COLLISION DETERMINATION UNIT

1320

AIRBAG

SAFETY DEVICE CONTROL UNIT

ACCELERATOR

ENGINE CONTROL UNIT

BRAKE

BRAKE CONTROL UNIT

STEERING

STEERING CONTROL UNIT

TRANSMISSION

DRIVE CONTROL UNIT

1312

ALERT DEVICE

FIG. 33

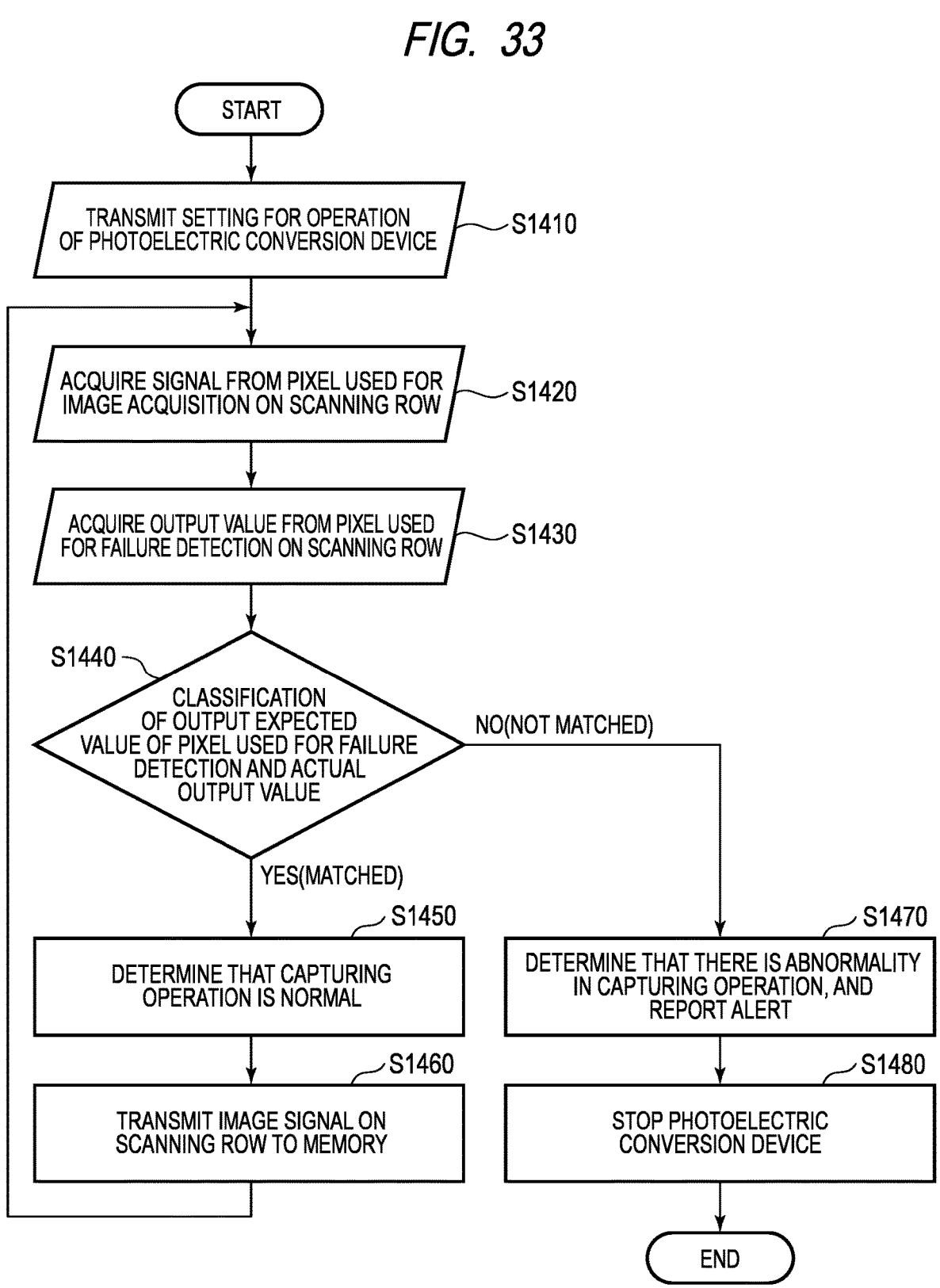

START

TRANSMIT SETTING FOR OPERATION OF PHOTOELECTRIC CONVERSION DEVICE — S1410

ACQUIRE SIGNAL FROM PIXEL USED FOR IMAGE ACQUISITION ON SCANNING ROW — S1420

ACQUIRE OUTPUT VALUE FROM PIXEL USED FOR FAILURE DETECTION ON SCANNING ROW — S1430

S1440 — CLASSIFICATION OF OUTPUT EXPECTED VALUE OF PIXEL USED FOR FAILURE DETECTION AND ACTUAL OUTPUT VALUE

NO(NOT MATCHED)

YES(MATCHED)

S1450 — DETERMINE THAT CAPTURING OPERATION IS NORMAL

S1470 — DETERMINE THAT THERE IS ABNORMALITY IN CAPTURING OPERATION, AND REPORT ALERT

S1460 — TRANSMIT IMAGE SIGNAL ON SCANNING ROW TO MEMORY

S1480 — STOP PHOTOELECTRIC CONVERSION DEVICE

END

PHOTOELECTRIC CONVERSION DEVICE, IMAGING SYSTEM, AND MOVABLE BODY

BACKGROUND

Field

The present disclosure relates to a photoelectric conversion device, an imaging system, and a movable body.

Description of the Related Art

Japanese Patent Application Laid-Open No. 2021-061330 discloses a photoelectric conversion device in which quantum efficiency is improved by providing a concavo-convex structure on the light receiving surface of the photoelectric conversion device.

However, the concavo-convex structure disclosed in Japanese Patent Application Laid-Open No. 2021-061330 may not be always sufficient in terms of sensitivity to incident light.

The present disclosure is made to provide a photoelectric conversion device, an imaging system, and a movable body that can further increase sensitivity.

SUMMARY

A photoelectric conversion device according to one aspect of the present disclosure includes a pixel isolation portion and a concavo-convex structure. The pixel isolation portion is arranged between adjacent pixels of a plurality of pixels formed on a semiconductor layer. The concavo-convex structure is formed on a light receiving surface of the semiconductor layer. The concavo-convex structure includes a trench extending toward an oblique direction from the light receiving surface to an inside of the semiconductor layer. The trench is filled with material that is different from material of the semiconductor layer positioned around the trench.

Further features of the present disclosure will become apparent from the following description of exemplary embodiments with reference to the attached drawings.

BRIEF DESCRIPTION OF THE DRAWINGS

FIG. 3 is a diagram illustrating an arrangement example of a circuit substrate according to the first embodiment.

FIG. 19C is a plan view of the concavo-convex structure according to the seventh embodiment.

FIG. 26 is a cross-sectional view of the concavo-convex structure according to the eleventh embodiment.

FIG. 31 is a schematic diagram of a light detection system according to the sixteenth embodiment.

FIG. 33 is a flowchart illustrating an operation of the light detection system according to the sixteenth embodiment.

DESCRIPTION OF THE EMBODIMENTS

Figure 1:
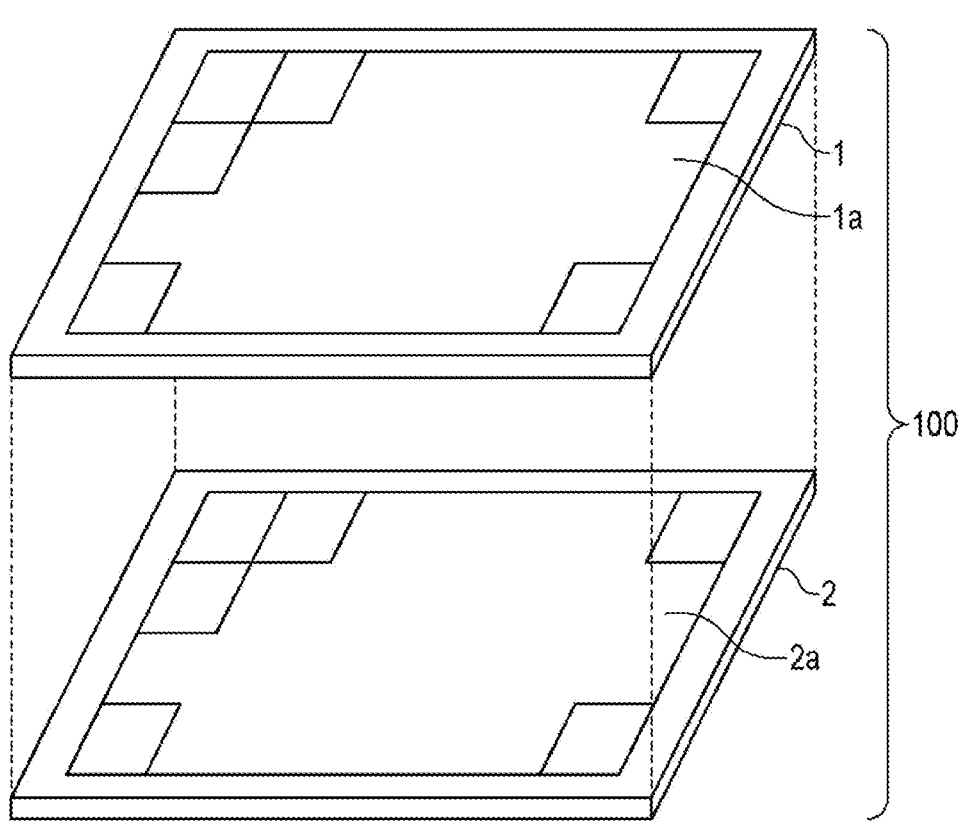
FIG. 1 is a schematic diagram of a photoelectric conversion device according to the first embodiment.

Embodiments of the present disclosure will be described below with reference to the accompanying drawings. The following embodiments are intended to embody the technical idea of the present disclosure and do not limit the present disclosure. The sizes and positional relationships of the members shown in the drawings may be exaggerated for clarity of explanation. In the following description, the same components are denoted by the same reference numerals, and description thereof may be omitted.

In the following description, terms indicating a specific direction or position (for example, "top", "bottom", "right", "left", and other terms including those terms) are used as necessary. The use of those terms is to facilitate understanding of the embodiments with reference to the drawings, and the technical scope of the present disclosure is not limited by the meaning of those terms.

First Embodiment

The configuration of the photoelectric conversion device according to the present embodiment will be described with reference to FIGS. 1 to 4. The photoelectric conversion device includes SPAD pixels each including an avalanche photodiode (hereinafter referred to as "APD"). Of charge pairs generated in the APD, a conductivity type of charge used as a signal charge is referred to as a first conductivity type. The first conductivity type refers to a conductivity type in which a charge having the same polarity as the signal charge is used as a majority carrier. Further, a conductivity type opposite to the first conductivity type is referred to as a second conductivity type. The following explanation describes an example in which the signal charges are electrons, the first conductivity type is N-type, and the second conductivity type is P-type. However, the signal charges may be holes, the first conductivity type may be P-type, and the second conductivity type may be N-type. In this specification, the term "plan view" refers to a view from a direction perpendicular to a light incident surface of a semiconductor substrate described later. The "cross section" refers to a surface in a direction perpendicular to the light incident surface of the sensor substrate 1. When the light incident surface of the semiconductor layer is a rough surface when viewed microscopically, a planar view is defined with reference to the light incident surface of the semiconductor layer when viewed macroscopically. The "depth direction" is a direction from the light incident surface (first surface) of the sensor substrate 1 toward the surface (second surface) on which the circuit substrate 2 is arranged.

FIG. 1 is a schematic diagram of a photoelectric conversion device according to the present embodiment, and shows a configuration of a stacked photoelectric conversion device 100. The photoelectric conversion device 100 includes a sensor substrate (first substrate) 1 and a circuit substrate (second substrate) 2 stacked on each other, and the sensor substrate 1 and the circuit substrate 2 are electrically connected to each other. The photoelectric conversion device according to the present embodiment is a back-illuminated photoelectric conversion device in which light is incident from a first surface of the sensor substrate 1 and the circuit substrate 2 is arranged on a second surface of the sensor substrate 1. The sensor substrate 1 includes a first semiconductor layer having photoelectric conversion elements described later and a first wiring structure. The circuit substrate 2 includes a second semiconductor layer having a circuit such as a signal processing unit described later and a second wiring structure. The photoelectric conversion device 100 is formed by stacking the second semiconductor layer, the second wiring structure, the first wiring structure, and the first semiconductor layer in this order.

Hereinafter, the sensor substrate 1 and the circuit substrate 2 may be diced chips, but are not limited to chips. For example, each substrate may be a wafer. Further, each substrate may be diced after being laminated in a wafer state, or chips may be stacked and bonded after being formed into chips. The sensor substrate 1 is provided with a pixel region 1a, and the circuit substrate 2 is provided with a circuit region 2a for processing a signal detected by the pixel region 1a.

Figure 2:
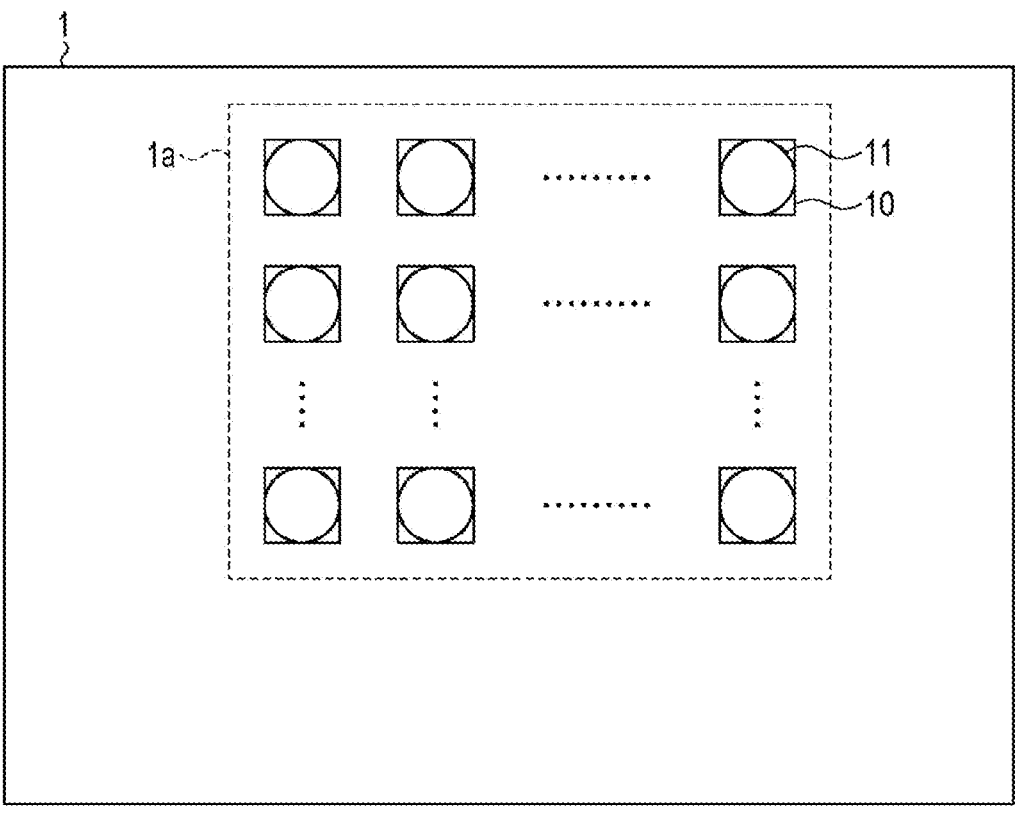
FIG. 2 is a diagram illustrating an arrangement example of a sensor substrate in the first embodiment.

FIG. 2 is a diagram illustrating an arrangement example of the sensor substrate 1. The plurality of pixels 10 each include an APD 11, and are arranged in a two-dimensional array in a plan view to form a pixel region 1a.

The pixel 10 is typically a pixel for forming an image, but when it is used in a TOF (Time of Flight), the pixel 10 does not necessarily need to form an image. That is, the pixel 10 may be a pixel for measuring the time at which light reaches and the amount of light.

Figure 3:
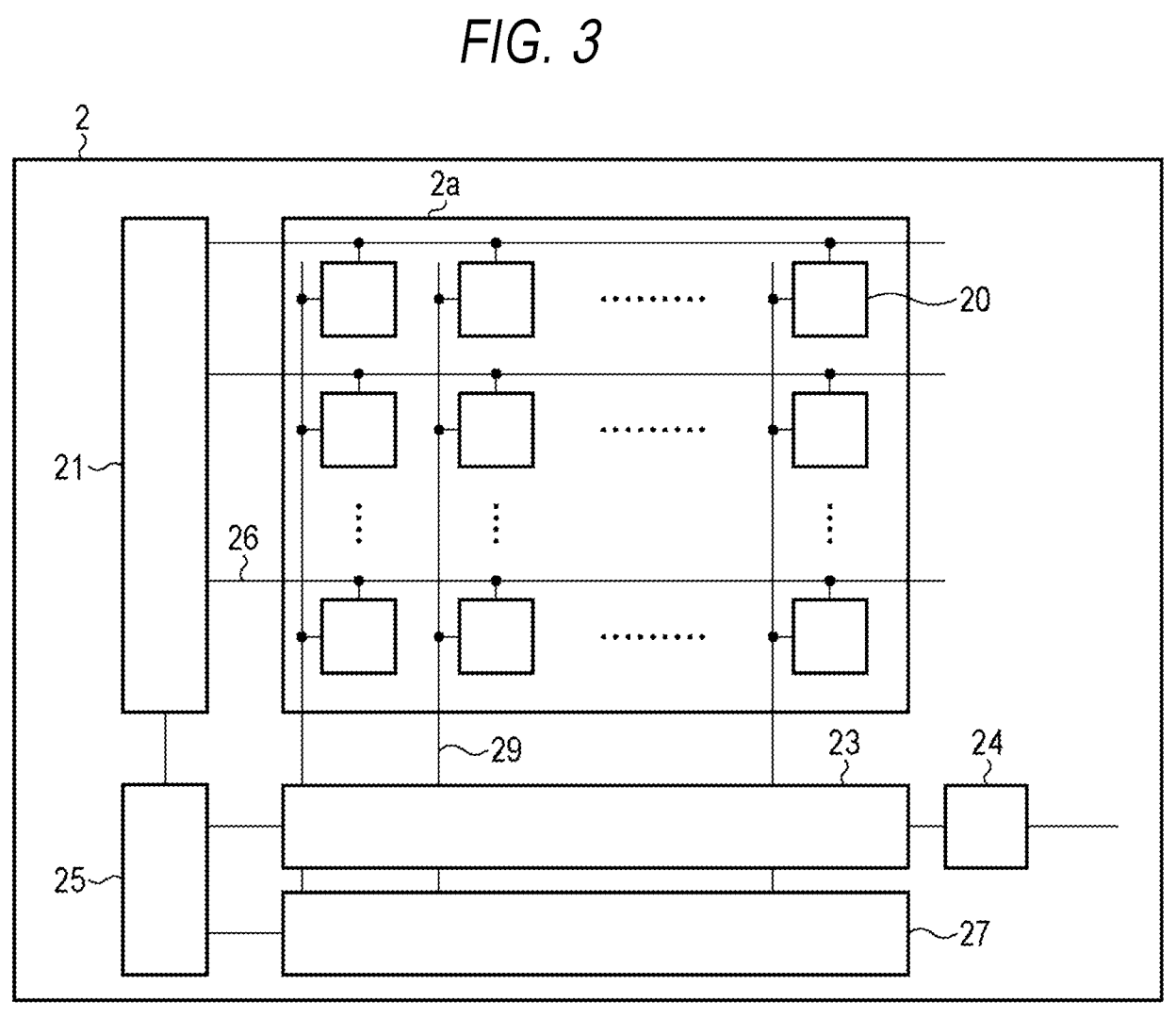

FIG. 3 is a diagram illustrating an arrangement example of the circuit substrate 2. The circuit substrate 2 includes a signal processing unit or circuit 20, a vertical scanning circuit 21, a readout circuit 23, a horizontal scanning circuit 27, an output calculation unit or circuit 24, a control pulse generation circuit 25, a scanning line 26, and a signal line 29. The circuit region 2a is arranged in a region overlapping the pixel region 1a in FIG. 2 in a plan view. Further, in the plan view in FIG. 2, the vertical scanning circuit 21, the readout circuit 23, the horizontal scanning circuit 27, the output calculation unit 24, and the control pulse generation circuit 25 are disposed to overlap with a region between the edge of the sensor substrate 1 and the edge of the pixel region 1a. That is, the sensor substrate 1 has a pixel region 1a and a non-pixel region arranged around the pixel region 1a, and the vertical scanning circuit 21, the readout circuit 23, the horizontal scanning circuit 27, the output calculation unit 24, and the control pulse generation circuit 25 are arranged in a region overlapping the non-pixel region in a plan view.

The signal processing units 20 are electrically connected to the pixels 10 through connection wirings each provided for the pixel 10, and are arranged in a two-dimensional array in a plan view, similarly to the pixels 10. The signal processing unit 20 includes a binary counter that counts photons incident on the pixel 10.

The vertical scanning circuit 21 receives a control pulse supplied from the control pulse generation circuit 25, and supplies the control pulse to the signal processing unit 20 corresponding to the pixels 10 in each row via the scanning line 26. The vertical scanning circuit 21 may include a logic circuit such as a shift register or an address decoder.

The readout circuit 23 acquires a pulse count value of a digital signal from the signal processing unit 20 of each row via the signal line 29. Then, an output signal is output to a signal processing circuit (signal processing device) outside the photoelectric conversion device 100 via the output calculation unit 24. The readout circuit 23 may have a function of a signal processing circuit for correcting the pulse count value or the like. The horizontal scanning circuit 27 receives the control pulse from the control pulse generation circuit 25, and sequentially outputs the pulse count value of each column in the readout circuit 23 to the output calculation unit 24. As described later, when the pulse count value exceeds a threshold value, the output calculation unit 24 estimates an actual image signal (pulse count value) based on the time count value included in additional information and the threshold value, and replaces (extrapolates) the pulse count value with the estimated pulse count value. On the other hand, when the pulse count value is equal to or smaller than the threshold value, the pulse count value is output as an image signal as it is.

The output calculation unit 24 performs a predetermined process on the pulse count value read by the readout circuit 23, and outputs an image signal to the outside. As will be described later, when the pulse count value exceeds the threshold value, the output calculation unit 24 can perform processing such as calculation of the pulse count value.

In FIG. 2, the arrangement of photoelectric conversion elements in the pixel region 1a may be one-dimensionally arranged. In addition, the effect of the present disclosure can be achieved even in a configuration in which one pixel is provided, and a configuration in which one pixel is provided can be included in the present disclosure. In the photoelectric conversion device having a plurality of pixels, the effect of suppressing the circuit scale according to the present embodiment becomes more significant. It is not necessary to provide one signal processing unit 20 for every pixel 10. For example, one signal processing unit 20 may be shared by a plurality of pixels 10 and signal processing may be sequentially performed.

Figure 4:
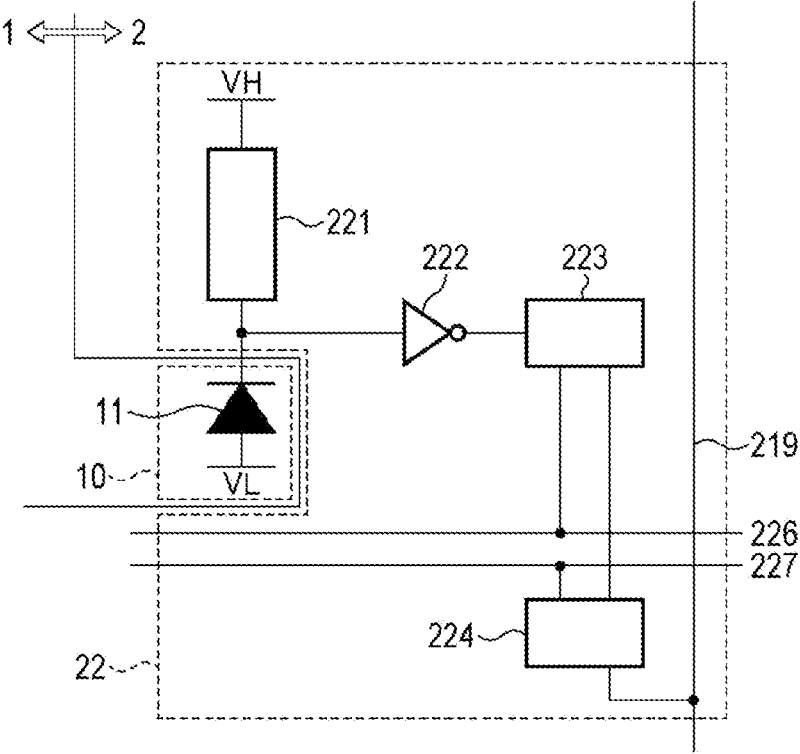
FIG. 4 is a circuit diagram of an APD and a pulse generator according to the first embodiment.

FIG. 4 is a block diagram of the APD and a pulse generation unit according to the present embodiment. FIG. 4 illustrates the pixels 10 of the sensor substrate 1 and a pulse generation unit 22 in the signal processing unit 20 of the circuit substrate 2. The APD 11 is disposed in the pixel 10. The pulse generation unit 22 includes a quenching element 221, a waveform shaping unit 222, a counter circuit 223, and a selection circuit 224.

The APD 11 generates charge pairs corresponding to incident light by photoelectric conversion. A voltage VL (first voltage) is supplied to an anode of the APD 11. A voltage VH (second voltage) higher than the voltage VL supplied to the anode is supplied to a cathode of the APD 11. A reverse bias voltage is applied to the anode and the cathode, and the APD 11 is in a state capable of avalanche multiplication. When photons enter the APD 11 in a state where the reverse bias voltage is supplied, charges generated by the photons cause avalanche multiplication, and an avalanche current is generated.

The APD 11 can operate in a Geiger mode or a linear mode according to the voltage of the reverse bias. The Geiger mode is an operation in a state where the potential difference between the anode and the cathode is higher than the breakdown voltage, and the linear mode is an operation in a state where the potential difference between the anode and the cathode is near or lower than a breakdown voltage. An APD operating in the Geiger mode is particularly referred to as SPAD or SPAD-type. As an example, the voltage VL (first voltage) may be −30 V and the voltage VH (second voltage) may be 1 V. The APD 11 may operate in a linear mode or a Geiger mode. When the APD 11 operates as the SPAD, the potential difference becomes larger than that of the APD 11 in the linear mode, and the effect of the withstand voltage becomes significant. Accordingly, the SPAD is preferable in this case.

The quenching element 221 is provided between the power supply line for supplying the voltage VH and the cathode of the APD 11. The quenching element 221 functions as a load circuit (quenching circuit) at the time of signal multiplication by avalanche multiplication, and has a function of suppressing a voltage supplied to the APD 11 and suppressing avalanche multiplication (quenching operation). Further, the quenching element 221 has a function of returning the voltage supplied to the APD 11 to the voltage VH by flowing a current corresponding to the voltage drop in the quenching operation (recharging operation).

The waveform shaping unit 222 functions as a signal generation unit that generates a detection pulse based on an output generated by incidence of a photon. That is, the waveform shaping unit 222 shapes the potential change of the cathode of the APD 11 obtained at the time of photon detection, and outputs a rectangular wave pulse signal (detection pulse). As the waveform shaping unit 222, for example, an inverter circuit is used. Although FIG. 4 shows an example in which one inverter is used as the waveform shaping unit 222, a circuit having a plurality of inverters are connected in series may be used. Other circuits having a waveform shaping effect may also be used.

The counter circuit 223 counts the pulse signals output from the waveform shaping unit 222 and holds the count value. Further, a control pulse is supplied from the vertical scanning circuit 21 shown in FIG. 3 to the counter circuit 223 through a driving line 226 included in the scanning line 26. When the control pulse becomes active, the signal held in the counter circuit 223 is reset.

The selection circuit 224 includes a switch circuit, a buffer circuit for outputting a signal, and the like. The selection circuit 224 is supplied with a control pulse from the vertical scanning circuit 21 shown in FIG. 3 through a driving line 227. In accordance with the control pulse, the selection circuit 224 electrically switches a connected state or a non-connected state between the counter circuit 223 and a signal line 219.

A switch such as a transistor may be provided between the quenching element 221 and the APD 11, and between the APD 11 and the signal processing unit 20. Alternatively, the supply of the voltage VH or the voltage VL may be electrically switched by a switch such as a transistor.

Figure 5A:
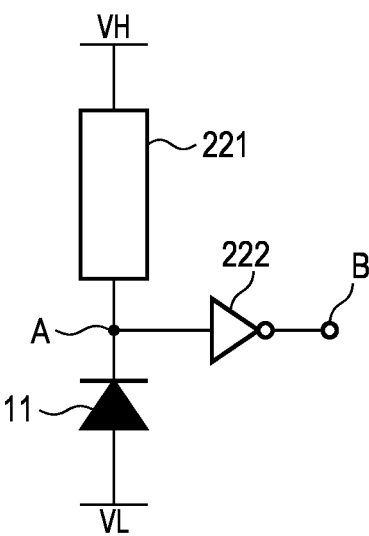
FIG. 5A is a diagram illustrating the relationship between the operation of the APD and an output signal in the first embodiment.
Figures 5B, 5C:
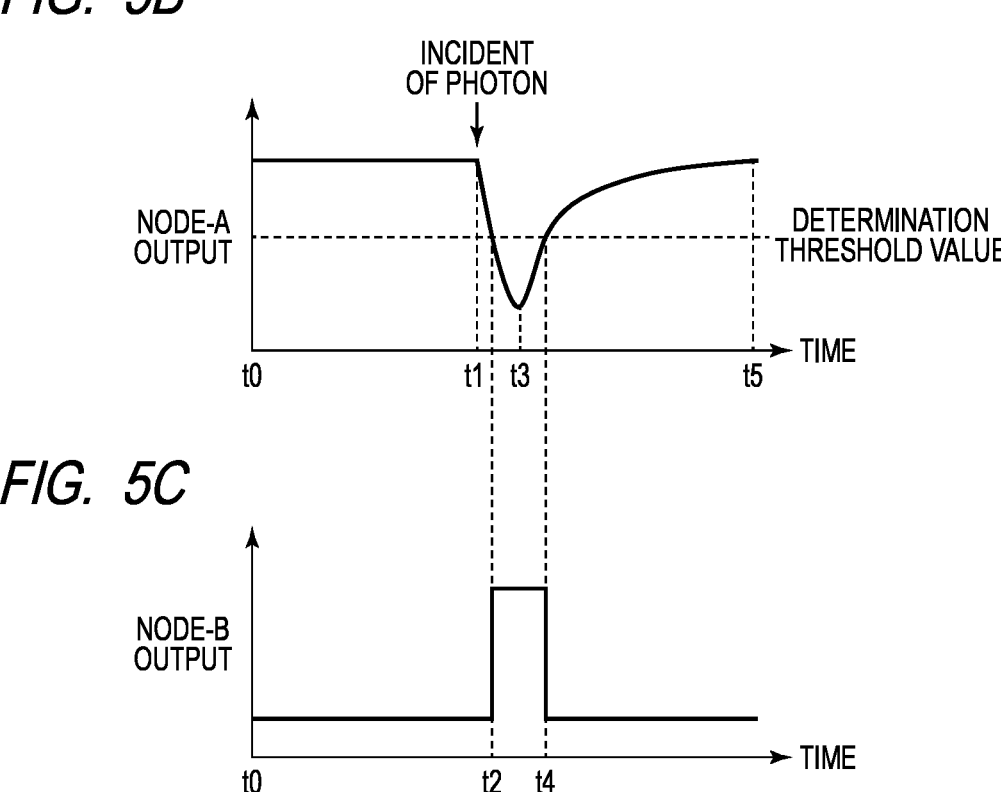
FIG. 5B is a diagram illustrating the relationship between the operation of the APD and an output signal in the first embodiment.
FIG. 5C is a diagram illustrating the relationship between the operation of the APD and an output signal in the first embodiment.

FIGS. 5A, 5B, and 5C are diagrams illustrating the relationship between the operation of the APD and the output signal in the present embodiment. FIG. 5A is a diagram extracted from the APD 11, the quenching element 221, and the waveform shaping unit 222 in FIG. 4. When the input side and the output side of the waveform shaping unit 222 are node A and node B, FIG. 5B illustrates a waveform change of node A and FIG. 5C illustrates a waveform change of node B.

In a period from time t0 to time t1, a reverse bias voltage of VH-VL is applied to the APD 11. When a photon is incident on the APD 11 at the time t1, avalanche multiplication occurs in the APD 11, an avalanche multiplication current flows in the quenching element 221, and the voltage of node A drops. When the voltage drop further increases and the potential difference applied to the APD 11 decreases, the avalanche multiplication of the APD 11 stops at time t3, and the voltage level of the node A does not drop by a certain constant value or more. After that, in a period from time t3 to time t5, a current that compensates a voltage drop from the voltage VL flows through the node A, and at the time t5, the node A is settled to the original voltage level. At this time, from time t2 to time t4, when the voltage level of the node A is lower than the threshold value of the waveform shaping unit 222, the node B becomes high level. That is, the voltage waveform of node A is shaped by the waveform shaping unit 222, and a rectangular wave pulse signal is output from node B.

Figure 6:
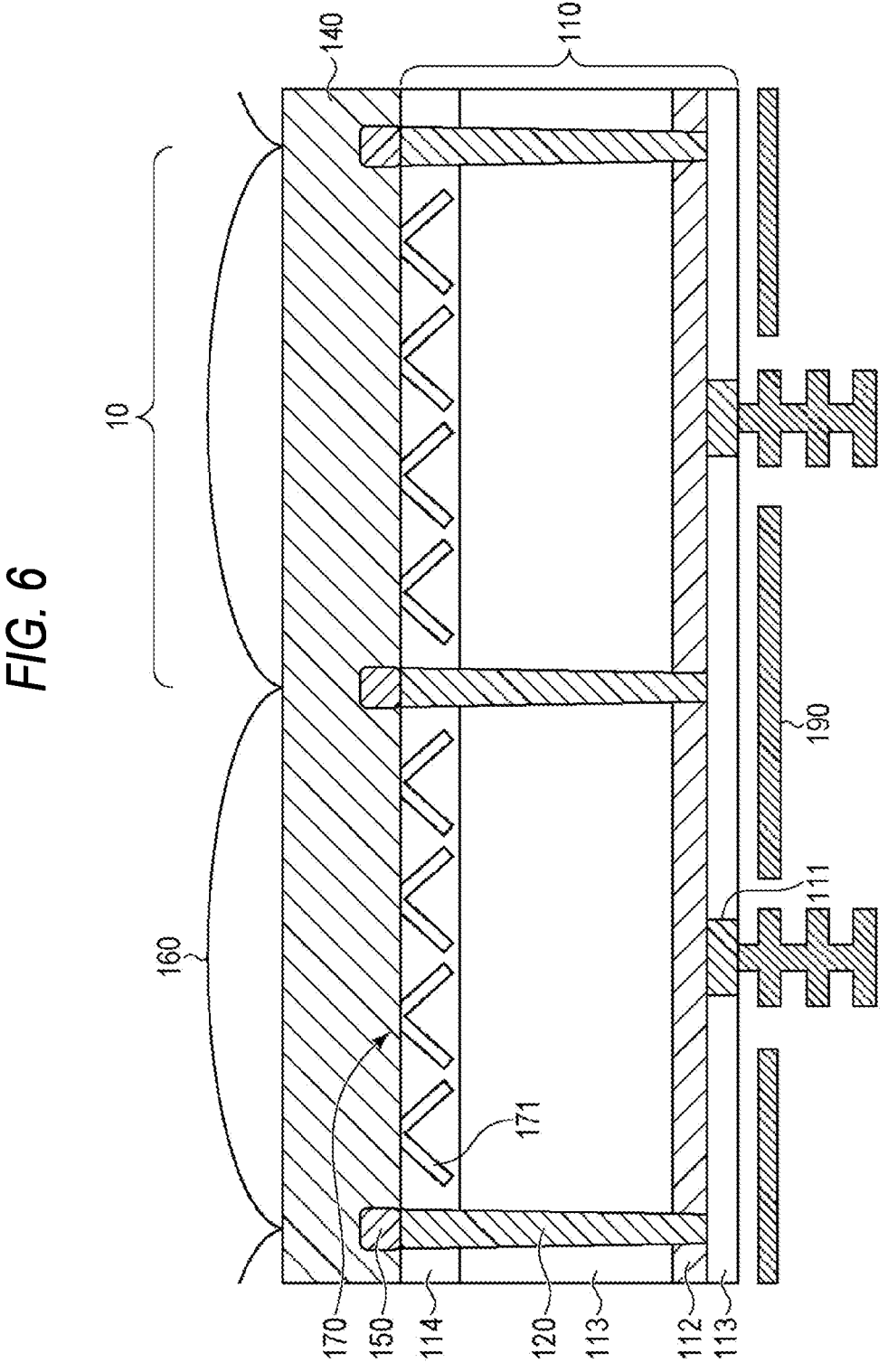
FIG. 6 is a cross-sectional view of a plurality of adjacent pixels in the first embodiment.

The structure of the pixel 10 according to the present embodiment will be described with reference to FIGS. 6 to 8C. FIG. 6 is a cross-sectional view of a plurality of adjacent pixels. As shown in FIG. 6, the pixel 10 includes a semiconductor layer 110 and an insulating layer 140.

The semiconductor layer 110 includes a plurality of semiconductor regions constituting the APD 11. The semiconductor layer 110 has a first surface on which light enters and a second surface which is a surface opposite to the first surface. In the present specification, the depth direction is a direction from the first surface to the second surface of the semiconductor layer 110 in which the APD 11 is arranged. Hereinafter, the "first surface" may be referred to as the "back surface" or the "light receiving surface", and the "second surface" may be referred to as the "front surface". The direction from a predetermined position of the semiconductor layer 110 toward the surface of the semiconductor layer 110 may be described as "deep". The direction from a predetermined position of the semiconductor layer 110 toward the back surface of the semiconductor layer 110 may be described as "shallow".

The semiconductor layer 110 is formed of silicon (Si), indium gallium arsenide (InGaAs), or the like. The semiconductor layer 110 has a first semiconductor region 111, a second semiconductor region 112, a third semiconductor region 113, and a fourth semiconductor region 114. The first semiconductor region 111 having the first conductivity type and the second semiconductor region 112 having the second conductivity type form a PN junction. The impurity concentration of the first semiconductor region 111 is higher than that of the second semiconductor region 112. A predetermined reverse bias voltage is applied to the first semiconductor region 111 and the second semiconductor region 112, thereby forming an avalanche multiplication region of the APD 11.

As shown in FIG. 6, the third semiconductor region 113 having the second conductivity type is arranged on the same layer as the first semiconductor region 111. The third semiconductor region 113 is also arranged at a position shallower than the second semiconductor region 112. The impurity concentration of the third semiconductor region 113 is lower than that of the second semiconductor region 112. The third semiconductor region 113 is a region for absorbing light incident from the light receiving surface. The fourth semiconductor region 114 having the second conductivity type is arranged at a position shallower than the third semiconductor region 113. The impurity concentration of the fourth semiconductor region 114 is higher than that of the third semiconductor region 113. A concavo-convex structure 170 including a plurality of trenches 171 described later is formed on the side of the light receiving surface of the fourth semiconductor region 114. The term "structure" refers to an arrangement of interrelated elements or an integral element constructed or patterned according to a predetermined form or shape. It may be an assembly of components or integral element, a pattern, an assembly, a part, a piece, or a segment.

A pixel isolation portion 120 having a structure in which an insulator (dielectric) is embedded in the semiconductor layer 110 is arranged between the pixels 10 adjacent to each other. The term "portion" refers to a part, a section, a segment, a circuit, or a sub-assembly of the semiconductor layer 110. The pixel isolation portion 120 has a deep trench isolation (DTI) structure. The pixel isolation portion 120 is formed by etching or the like. The pixel isolation portion 120 is formed from the side of the light receiving surface, and shallower than the thickness of the semiconductor layer 110. In the present embodiment, the pixel isolation portion 120 is formed to gradually decrease in width from the light receiving surface side toward the front (second) surface side. That is, the pixel isolation portion 120 has a wedge shape. The pixel isolation portion 120 repeatedly reflects incident light inside the semiconductor layer 110 to improve the efficiency of photoelectric conversion in the semiconductor layer 110 and the sensitivity of the pixels. By forming the pixel isolation portion 120 in a wedge shape, the lateral reflection efficiency of the semiconductor layer 110 can be enhanced.

The pixel isolation portion 120 may be formed in a columnar shape or in a prismatic shape. The pixel isolation portion 120 may be formed from the second (front) surface side, which is a surface facing the light receiving surface, or may be formed to penetrate the semiconductor layer 110. The pixel isolation portion 120 may be formed to surround the entire one pixel 10 or may be formed to partially surround the one pixel 10 in a plan view. The dielectric having a refractive index lower than that of a semiconductor element such as silicon oxide can be employed as an insulator used in the pixel isolation portion 120. As the pixel isolation portion 120, a metal other than an insulator may be used to enhance the light shielding property, and voids may be included. For example, a thin insulator layer may be formed on the sidewall portion of the DTI structure and filled with metal. The pixel isolation portion 120 can suppress transmission of incident light to adjacent pixels. That is, the crosstalk with adjacent pixels can be reduced by isolating one pixel from another pixel by using the pixel isolation portion 120.

On the light receiving surface side of the semiconductor layer 110, the insulating layer 140 is provided for flattening the surface on which light enters. The insulating layer 140 is formed of a dielectric material such as a silicon oxide film ($SiO_2$) or silicon nitride ($Si_3N_4$). A microlens 160 is formed on the surface of the insulating layer 140 on the side where the light enters for collecting incident light to the pixel 10.

A wiring layer 190 included in the first wiring structure of FIG. 1 is formed on the second surface side of the first semiconductor region 111. The wiring layer 190 is formed of a conductor material having characteristics of reflecting incident light transmitted through the light receiving surface. The wiring layer 190 can function as a reflecting layer for reflecting light incident from the light receiving surface and emitted to the surface toward the semiconductor layer 110. The reflection of incident light in the semiconductor layer 110 can be promoted and the efficiency of photoelectric conversion can be improved by providing the wiring layer 190.

A pinning layer may be further provided between the light receiving surface side of the semiconductor layer 110 on which the concavo-convex structure 170 is formed and the insulating layer 140. The pinning layer may be formed by chemical vapor deposition or the like using a high dielectric material such as hafnium oxide (HfO$_2$), aluminum oxide (Al$_2$O$_3$) or silicon nitride (Si$_3$N$_4$). The pinning layer has a shape corresponding to the shape of the concavo-convex structure 170, and is preferably formed sufficiently thin compared to the depth of the recess of the concavo-convex structure 170. Forming the pinning layer allows to suppress a dark current through defects existing on the light receiving surface side of the semiconductor layer 110. The defects are, for example, interface defects between the semiconductor layer 110 and the insulating layer 140 provided thereon.

As shown in FIG. 6, a light shielding portion 150 is provided between the pixel isolation portion 120 and the insulating layer 140. Any known material having light shielding properties can be used for the light shielding portion 150. The crosstalk with adjacent pixels can be further reduced by forming the light shielding portion 150.

In addition, a filter layer may be further provided between the microlens 160 and the semiconductor layer 110. Various optical filters such as a color filter, an infrared light cut filter, and a monochrome filter can be used as the filter layer. As the color filter, an RGB color filter, an RGBW color filter, or the like can be used.

Figure 7:
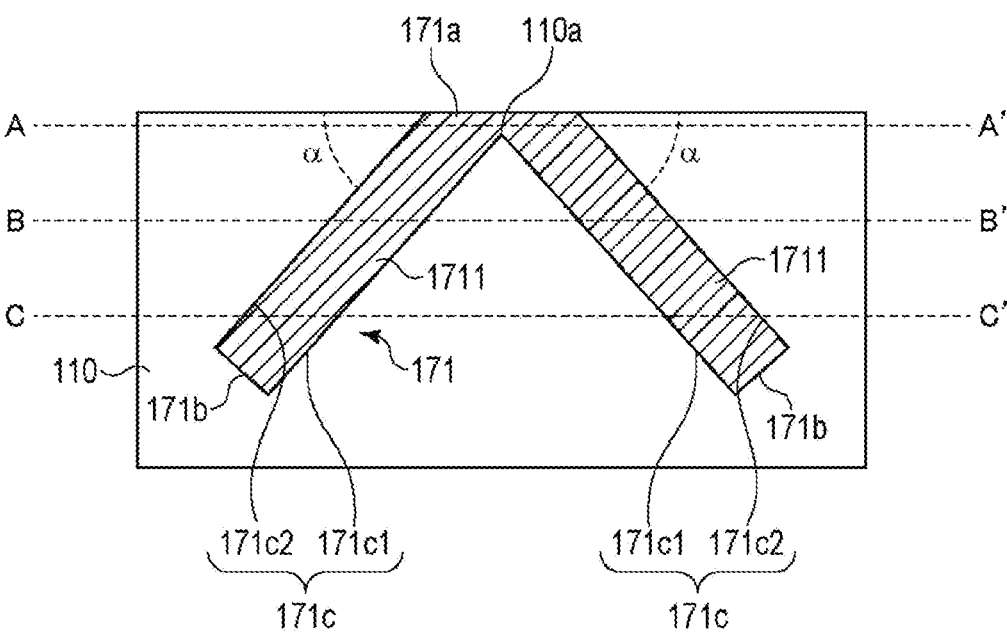
FIG. 7 is a cross-sectional view of the concavo-convex structure according to the first embodiment.
Figure 8A:
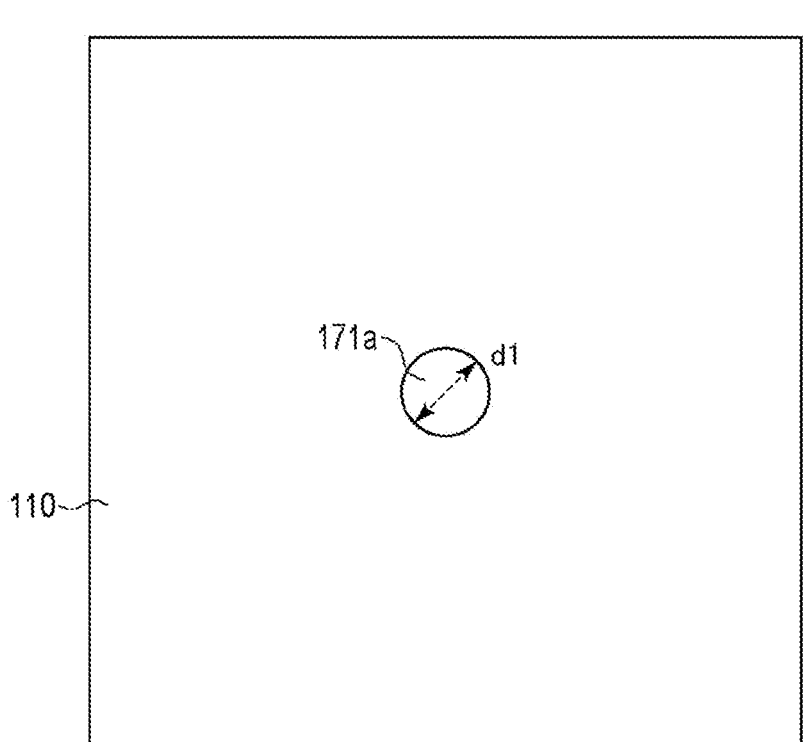
FIG. 8A is a plan view of the concavo-convex structure according to the first embodiment on the line A-A'.
Figure 8B:
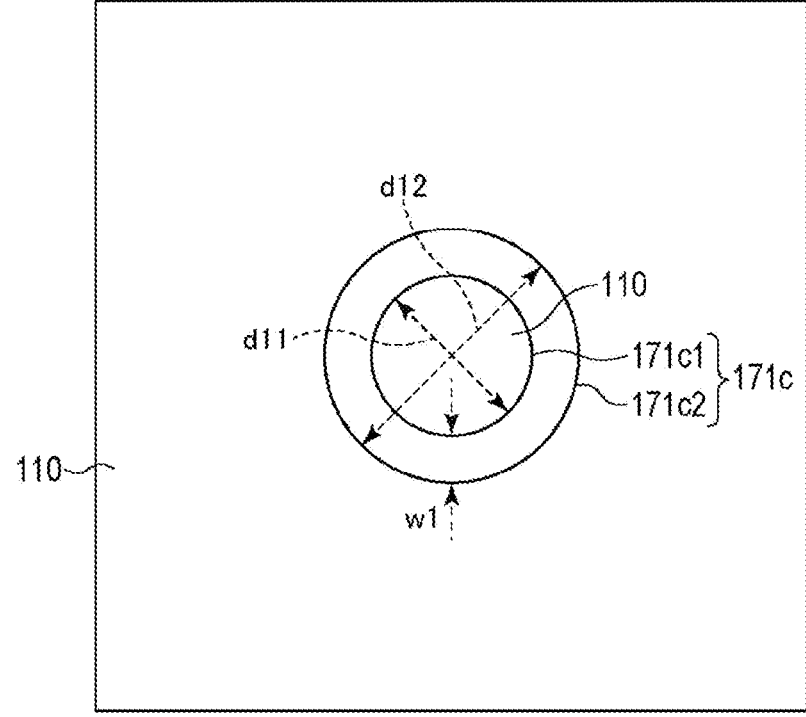
FIG. 8B is a plan view of the concavo-convex structure according to the first embodiment on the line B-B'.
Figure 8C:
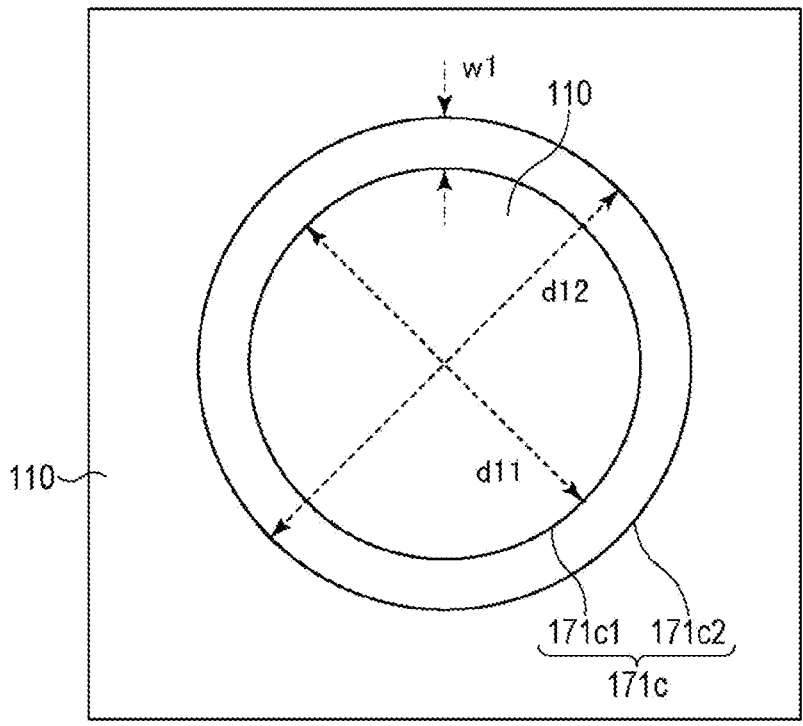
FIG. 8C is a plan view of the concavo-convex structure according to the first embodiment on the line C-C'.

FIG. 7 is a cross-sectional view of the concavo-convex structure in the present embodiment. FIGS. 8A to 8C show plan views parallel to the light receiving surface in the lines A-A', B-B', and C-C' of the concavo-convex structure shown in FIG. 7, respectively.

The concavo-convex structure 170 includes the trench 171 obliquely extending from the light receiving surface of the semiconductor layer 110 to the inside of the semiconductor layer 110, and the trench 171 includes an opening 171a, a bottom 171b, and an intermediate portion 171c. In the plan view of FIG. 8A, the opening 171a is circular, and a diameter d1 of the opening 171a is, for example, 0.2 μm or less, and preferably 0.1 μm or less. In order to increase the diffraction of incident light in the semiconductor layer 110, the diameter d1 of the opening 171a is preferably smaller than the depth of the trench 171. In the plan view of FIGS. 8B and 8C, the intermediate portion 171c of the trench 171 forms an annular portion having a width w1. That is, the intermediate portion 171c is defined by a sidewall 171c1 having a diameter d11 and a sidewall 171c2 having a diameter d12, and the width w1 becomes (d12−d11)/2. Further, as the depth from the light receiving surface to the intermediate portion 171c increases, the diameter of the intermediate portion 171c, that is, the diameters d11 and d12 increase. On the other hand, the width w1 can be constant regardless of the depth of the intermediate portion 171c. In the cross-sectional view shown in FIG. 7, the portion of the semiconductor layer 110 surrounded by the sidewalls 171c1 has a conical shape, and a conical top portion 110a is disposed at a position deeper than the light receiving surface of the semiconductor layer 110.

In the cross-sectional view shown in FIG. 7, the trench 171 extends obliquely from the light receiving surface of the semiconductor layer 110 to the inside of the semiconductor layer 110. The bottom 171b faces the opening 171a. The angle α formed between the direction from the opening 171a to the bottom 171b of the trench 171 and the light receiving surface of the semiconductor layer 110 may be, for example, less than 90 degrees, but may be arbitrarily determined according to the material of the filling member described later and the wavelength of the incident light. The distance, or depth, from the light receiving surface of the semiconductor layer 110 to the bottom 171b of the trench 171 may be between 0.1 μm and 0.6 μm.

Figure 9A:
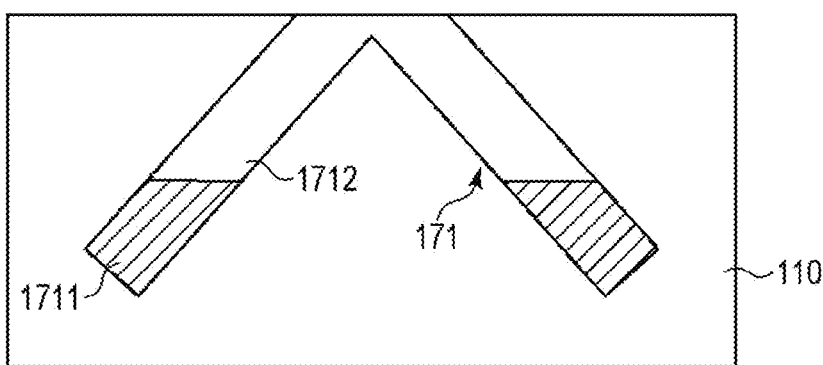
FIG. 9A is a cross-sectional view of the concavo-convex structure according to the first embodiment.
Figure 9B:
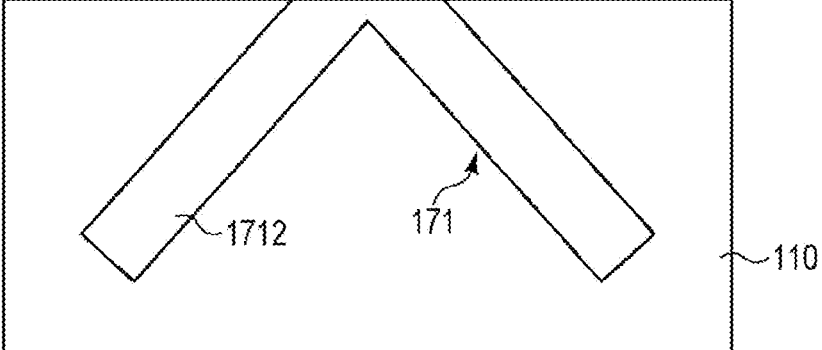
FIG. 9B is a cross-sectional view of the concavo-convex structure according to the first embodiment.

A filling member 1711 is formed in the trench 171. The filling member 1711 includes a material having optical properties (for example, the refractive index) different from those of the semiconductor layer 110 located around the trench 171, and can be a dielectric material such as silicon oxide film (SiO$_2$), silicon nitride (Si$_3$N$_4$), etc. In filling the filling member 1711, the process used for forming the pixel isolation portion 120 can be used. The filling member 1711 does not necessarily need to be filled in the entire trench 171. For example, as shown in FIG. 9A, only a portion of the trench 171 may be provided with the filling member 1711, and the other portion of the trench 171 may be a void 1712. As shown in FIG. 9B, the entire inside of the trench 171 may be the void 1712. Since the refractive index of the void 1712 is lower than that of the filling member 1711, the incident light passing through the void 1712 has a different optical path in the semiconductor layer 110 from the incident light passing through the filling member 1711. The difference in the optical path of the incident light increases a difference in the refractive index in the trench 171, which increases a phase difference of the incident light. Thus, the diffraction effect of the incident light in the semiconductor layer 110 can be increased, and the sensitivity to the incident light can be improved.

The trench 171 according to the present embodiment may be formed by performing the anisotropic etching to the semiconductor layer 110. Specifically, the sensor substrate 1 including the semiconductor layer 110 is attracted to a mounting table of an etching apparatus, and the anisotropic etching is performed with making the mounting table inclined. The angle α can be adjusted by changing the inclination angle of the mounting table during etching. The mounting table is rotated during etching to form the trenches 171 as shown in FIGS. 7 and 8A to 8C.

As described above, the trench 171 formed according to the present embodiment extends obliquely from the light receiving surface of the semiconductor layer 110 to the inside of the semiconductor layer 110. Therefore, the light incident on the semiconductor layer 110 can be scattered and refracted by the trench 171 multiple times. On the other hand, assuming that the trench is formed perpendicular to the light receiving surface, the incident light is refracted only once. In this case, it is difficult to improve the absorption efficiency of incident light in the semiconductor layer 110 and to improve the sensitivity. According to the present embodiment, the trench 171 extends obliquely from the light receiving surface of the semiconductor layer 110 to the inside of the semiconductor layer 110. Therefore, the light absorption efficiency in the semiconductor layer 110 can be enhanced and the sensitivity can be improved, as the light incident on the semiconductor layer 110 is scattered and refracted by the trench 171 multiple times. Such an effect becomes remarkable particularly for light having long wavelengths. Further, since the filling member 1711 having characteristics different from those of the semiconductor layer 110 is disposed in the trench, the effects of scattering and refraction become greater, which allows to further enhance the efficiency of the photoelectric conversion.

Second Embodiment

Figure 10:
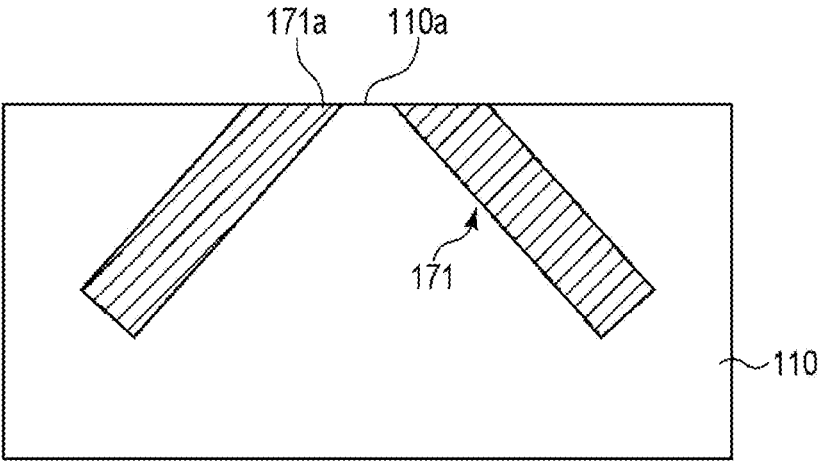
FIG. 10 is a cross-sectional view of the concavo-convex structure according to the second embodiment.

FIG. 10 is a cross-sectional view of the concavo-convex structure of the second embodiment. In the first embodiment, the opening 171*a* of the trench 171 has a circular shape in plan view, but the shape of the opening 171*a* is not limited to circular. For example, as shown in FIG. 10, the top portion 110*a* of the semiconductor layer 110 may be exposed at the opening 171*a*, and the opening 171*a* may be formed in a circular shape. For example, the top portion 110*a* of the semiconductor layer 110 can be exposed in the opening 171*a* by polishing the light receiving surface of the semiconductor layer 110 of the first embodiment using the chemical mechanical polishing (CMP) or the like. Similarly to the first embodiment, the present embodiment can also improve the sensitivity of the pixel 10 to incident light.

Third Embodiment

Figure 11:
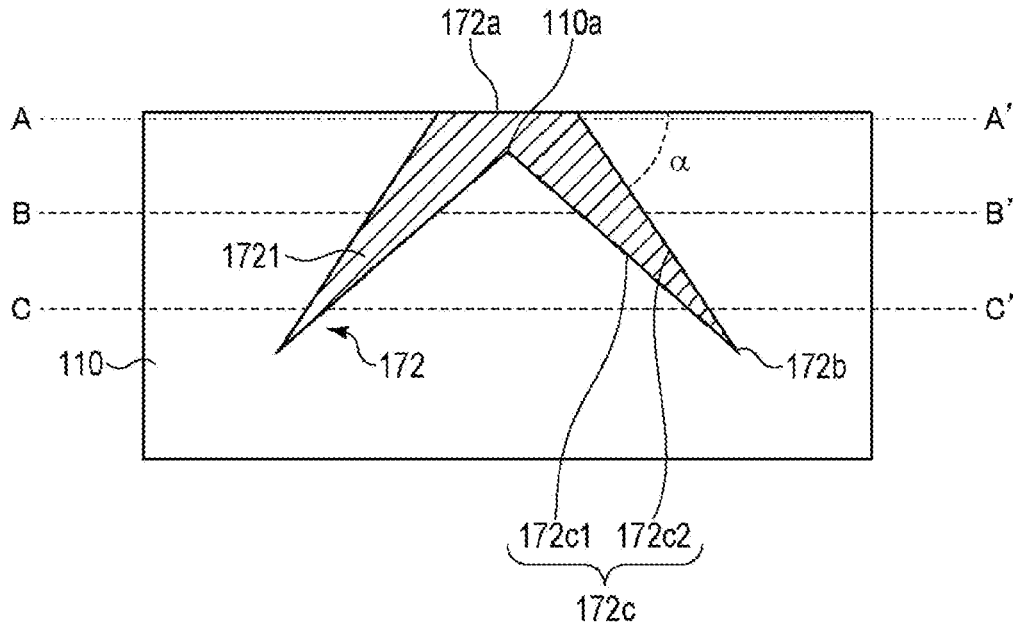
FIG. 11 is a cross-sectional view of the concavo-convex structure according to the third embodiment.
Figure 12A:
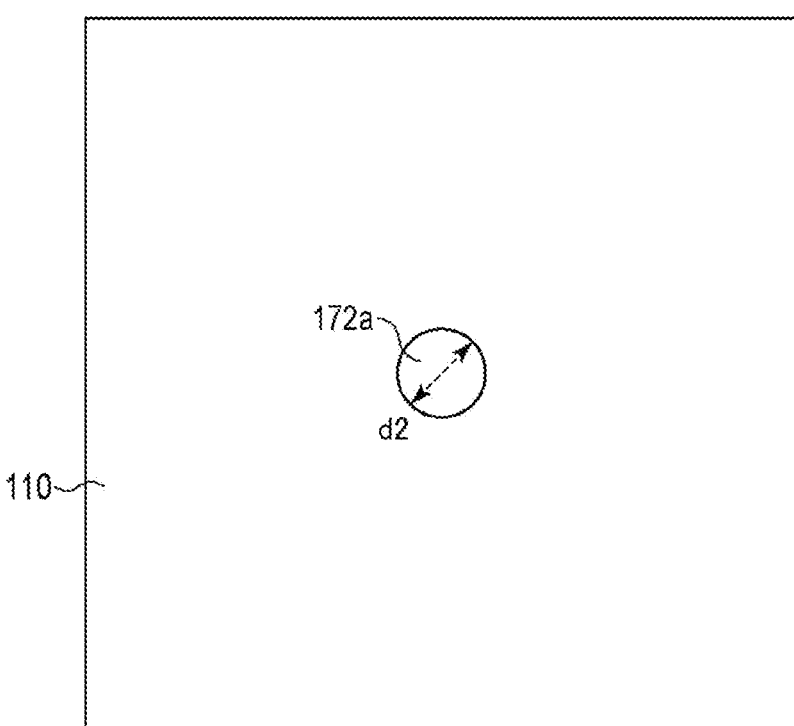
FIG. 12A is a plan view of the concavo-convex structure according to the third embodiment on the line A-A'.
Figure 12B:
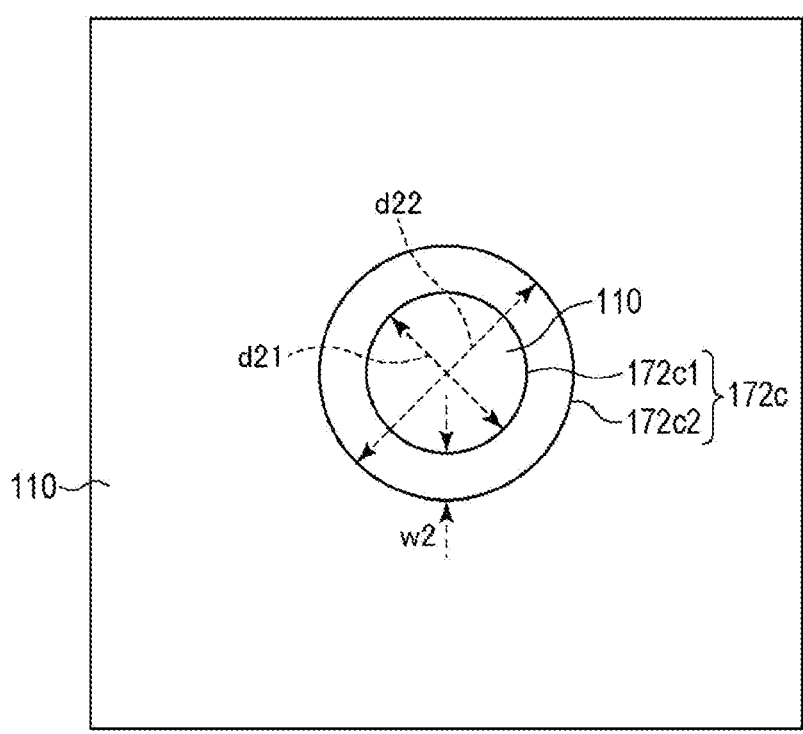
FIG. 12B is a plan view of the concavo-convex structure according to the third embodiment on the line B-B'.
Figure 12C:
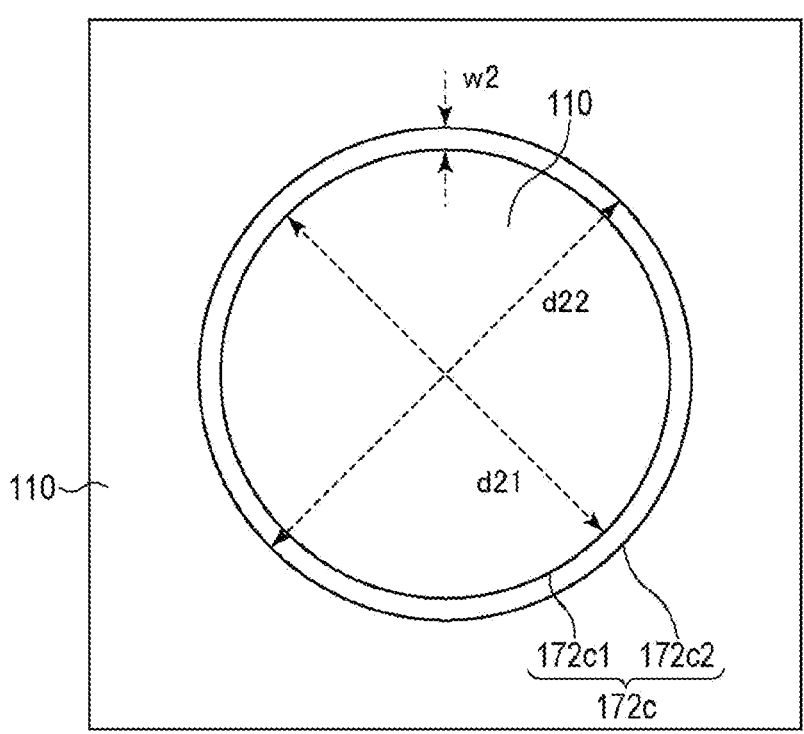
FIG. 12C is a plan view of the concavo-convex structure according to the third embodiment on the line C-C'.

The third embodiment of the present disclosure will be described. In the following embodiments, the configurations different from the first and second embodiments will be mainly described. FIG. 11 is a cross-sectional view of the concavo-convex structure of the present embodiment. FIGS. 12A to 12C are plan views of the concavo-convex structure of FIG. 11 taken along lines A-A', B-B', and C-C', respectively.

The concavo-convex structure 170 includes a trench 172 obliquely extending from the light receiving surface of the semiconductor layer 110 to the inside of the semiconductor layer 110, and the trench 172 includes an opening 172*a*, a bottom 172*b*, and an intermediate portion 172*c*. A filling member 1721 is formed in the trench 172. In the plan view of FIG. 12A, the opening 172*a* is circular with a diameter d2. In the plan view of FIGS. 12B and 12C, the intermediate portion 172*c* of the trench 172 constitutes an annular portion having a width w2. That is, the intermediate portion 172*c* is defined by a sidewall 172*c*1 having a diameter d21 and a sidewall 172*c*2 having a diameter d22, and the width w2 is (d22−d21)/2. Further, as the depth from the light receiving surface to the intermediate portion 172*c* increases, the diameter of the intermediate portion 172*c*, that is, the diameters d21 and d22 increase. The width w2 of the trench 172 in the plane at the C-C' line shown in FIG. 12C is smaller than the width w2 of the trench 172 in the plane at the B-B' line. The width w2 becomes narrower as the depth of the intermediate portion 172*c* becomes deeper, and the bottom 172*b* of the trench 172 has a tapered shape in a cross-sectional view.

In the present embodiment, the trench 172 extends obliquely from the light receiving surface of the semiconductor layer 110 to the inside of the semiconductor layer 110. Therefore, the light absorption efficiency of the semiconductor layer 110 can be enhanced and the sensitivity can be improved.

Fourth Embodiment

Figure 13:
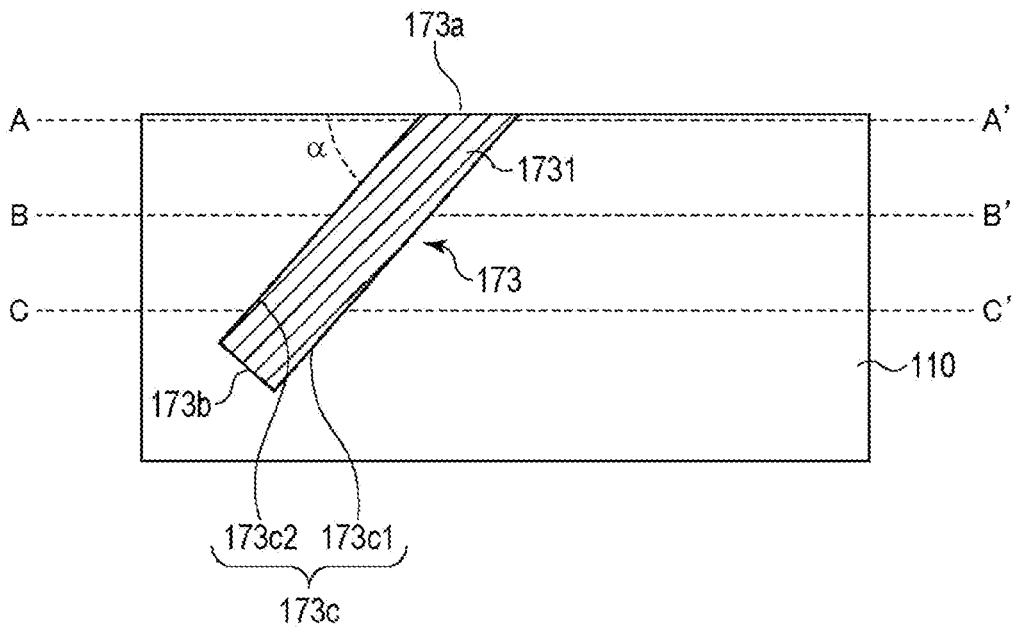
FIG. 13 is a cross-sectional view of the concavo-convex structure according to the fourth embodiment.
Figure 14A:
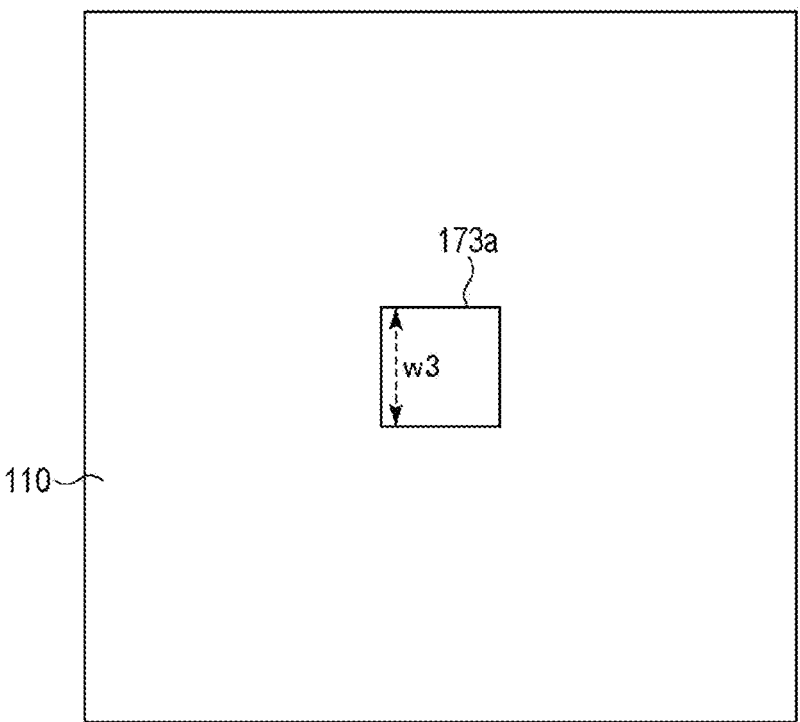
FIG. 14A is a plan view of the concavo-convex structure according to the fourth embodiment on the line A-A'.
Figure 14B:
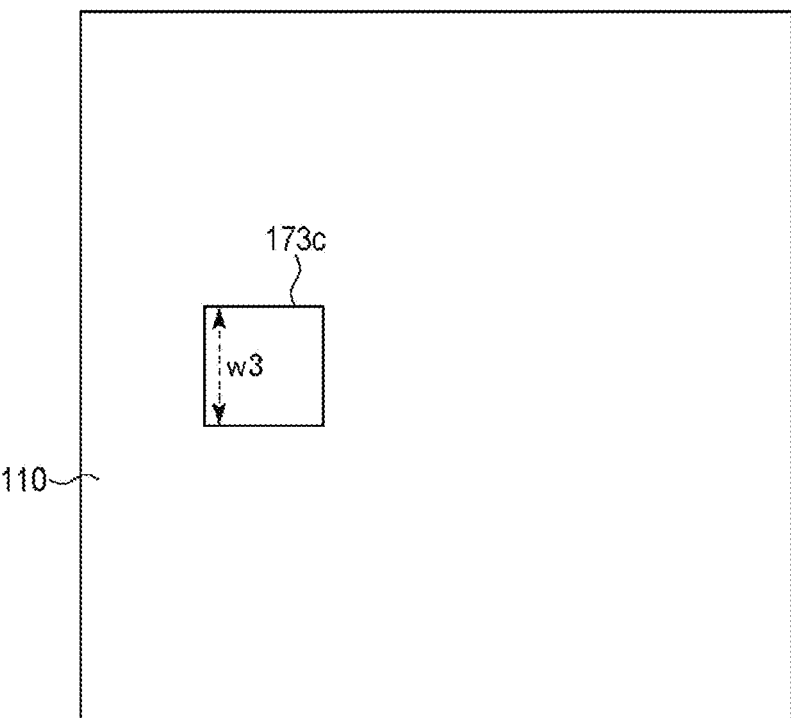
FIG. 14B is a plan view of the concavo-convex structure according to the fourth embodiment on the line B-B'.
Figure 14C:
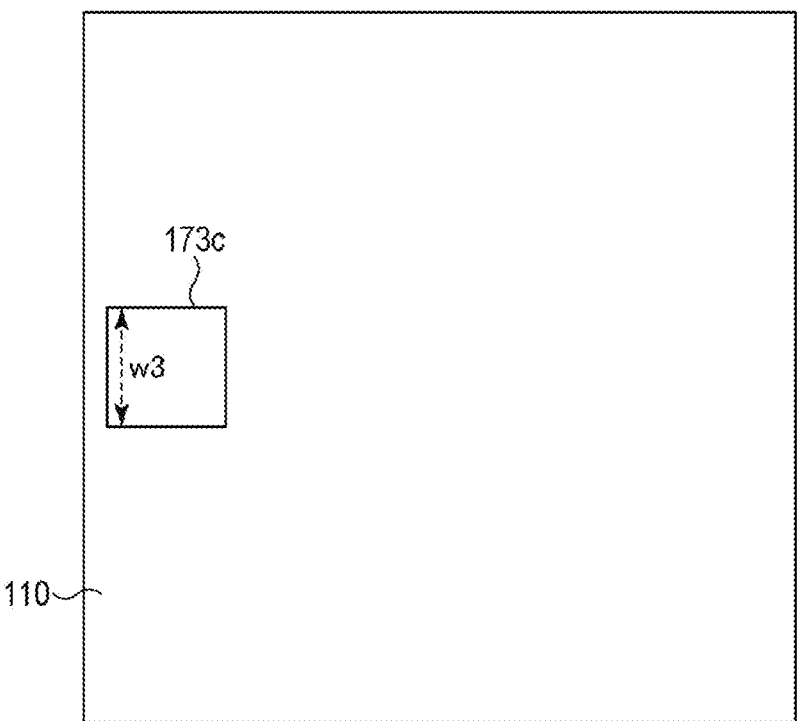
FIG. 14C is a plan view of the concavo-convex structure according to the fourth embodiment on the line C-C'.

The fourth embodiment of the present disclosure will be described. FIG. 13 is a cross-sectional view of the concavo-convex structure in the present embodiment. FIGS. 14A to 14C are plan views of the concavo-convex structure of FIG. 13 taken along lines A-A', B-B', and C-C', respectively.

The concavo-convex structure 170 includes a trench 173 obliquely extending from the light receiving surface of the semiconductor layer 110 to the inside of the semiconductor layer 110, and the trench 173 includes an opening 173*a*, a bottom 173*b*, and an intermediate portion 173*c*. A filling member 1731 is formed in the trench 173. In the plan view of FIG. 14A, the opening 173*a* is rectangular, and a width w3 of the opening 173*a* is, for example, 0.2 μm or less, and preferably 0.1 μm or less. In the plan view of FIGS. 14B and 14C, the shape of the intermediate portion 173*c* of the trench 173 corresponds to the shape of the opening 173*a* and has a rectangular shape having the width w3. The shape of the intermediate portion 173*c* is constant regardless of the depth of the intermediate portion 173*c*. The shapes of the opening 173*a*, the intermediate portion 173*c*, and the bottom 173*b* in plan view may be circular or polygonal other than rectangular.

Also in the present embodiment, the trench 173 extends obliquely from the light receiving surface of the semiconductor layer 110 to the inside of the semiconductor layer 110. Thus, the light absorption efficiency in the semiconductor layer 110 can be enhanced to improve the sensitivity.

Fifth Embodiment

Figure 15:
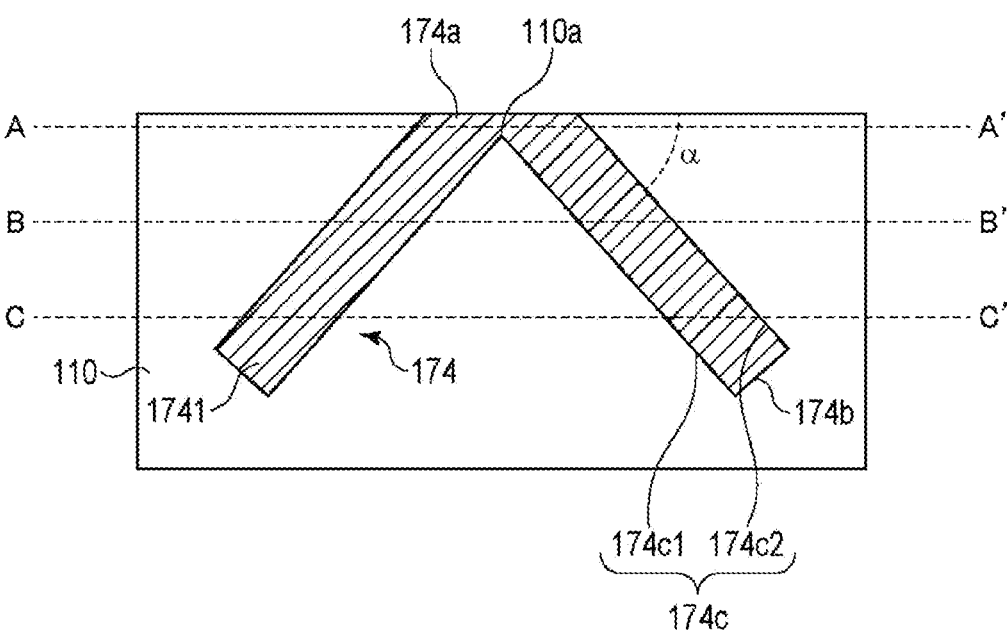
FIG. 15 is a cross-sectional view of the concavo-convex structure according to the fifth embodiment.
Figure 16A:
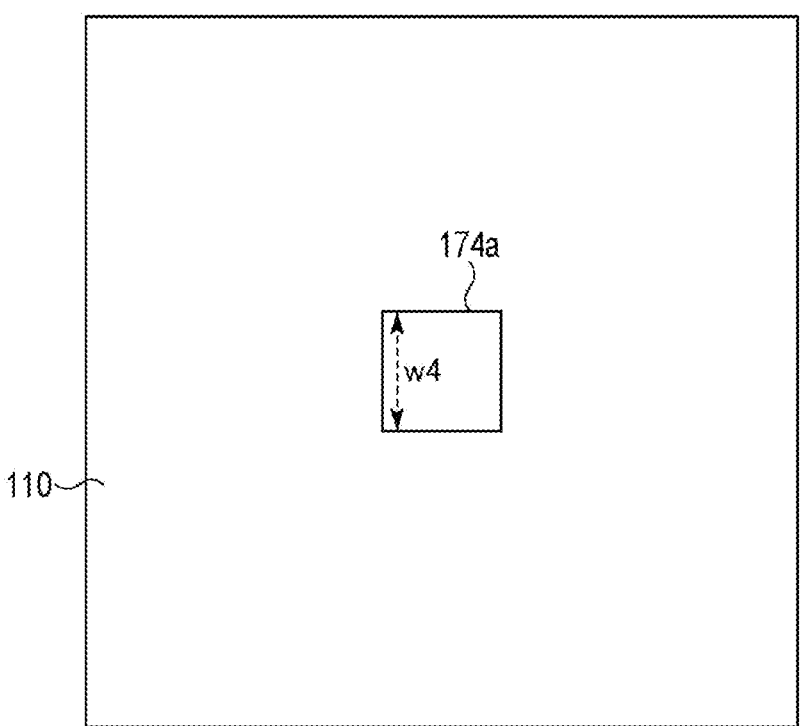
FIG. 16A is a plan view of the concavo-convex structure according to the fifth embodiment on the line A-A'.
Figure 16B:
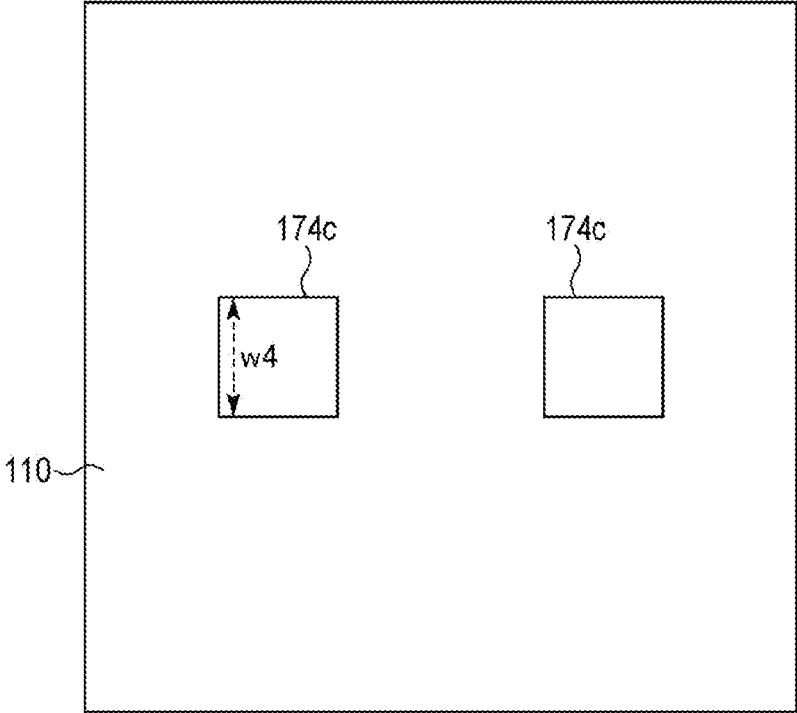
FIG. 16B is a plan view of the concavo-convex structure according to the fifth embodiment on the line B-B'.
Figure 16C:
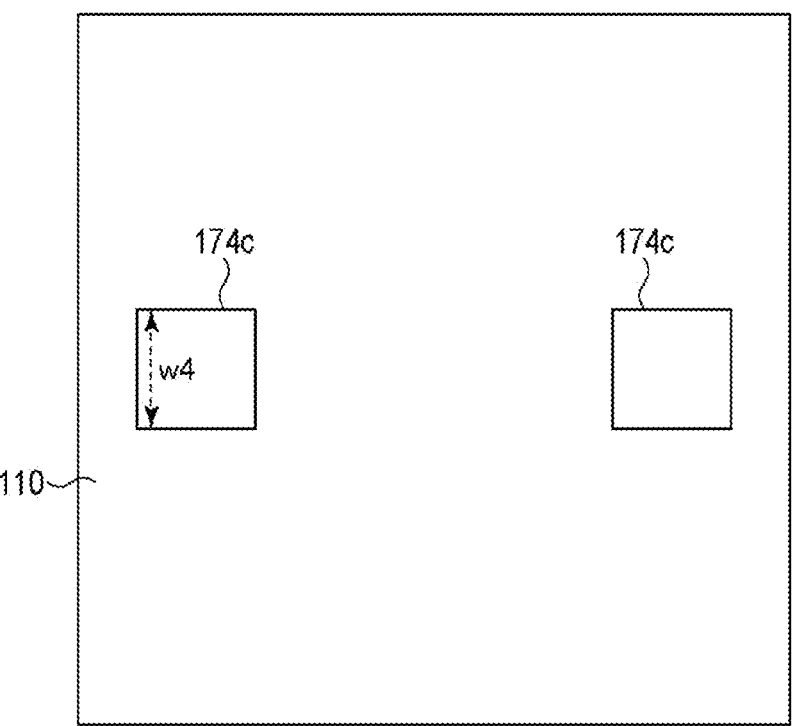
FIG. 16C is a plan view of the concavo-convex structure according to the fifth embodiment on the line C-C'.

A fifth embodiment of the present disclosure will be described. FIG. 15 is a cross-sectional view of the concavo-convex structure of the present embodiment. FIGS. 16A to 16C are plan views of the concavo-convex structure of FIG. 15 taken along lines A-A', B-B', and C-C', respectively.

The concavo-convex structure 170 includes a trench 174 obliquely extending from the light receiving surface of the semiconductor layer 110 to the inside of the semiconductor layer 110, and the trench 174 includes an opening 174*a*, a bottom 174*b*, and an intermediate portion 174*c*. A filling member 1741 is formed in the trench 174. In the plan view of FIG. 16A, the opening 174*a* has a rectangular shape having a width w4. In a plan view of FIGS. 16B and 16C, the two intermediate portions 174*c* branch from the one opening 174*a* and extend inside the semiconductor layer 110. That is, the two intermediate portions 174*c* share the one opening 174*a*. The shape of the intermediate portion 174*c* corresponds to the opening 174*a*, and the intermediate portion 174*c* has a rectangular shape having the width w4 as in the opening 174*a*. The shape of the intermediate portion 174*c* is constant regardless of the depth of the intermediate portion 174*c*. On the other hand, the two intermediate portions 174*c* are separated from each other as the two intermediate portions 174*c* extend deep from the light receiving surface.

Also in the present embodiment, the trench 174 extends obliquely from the light receiving surface of the semiconductor layer 110 to the inside of the semiconductor layer 110. Thus, the light absorption efficiency in the semiconductor layer 110 can be enhanced and the sensitivity can be improved.

Sixth Embodiment

Figure 17:
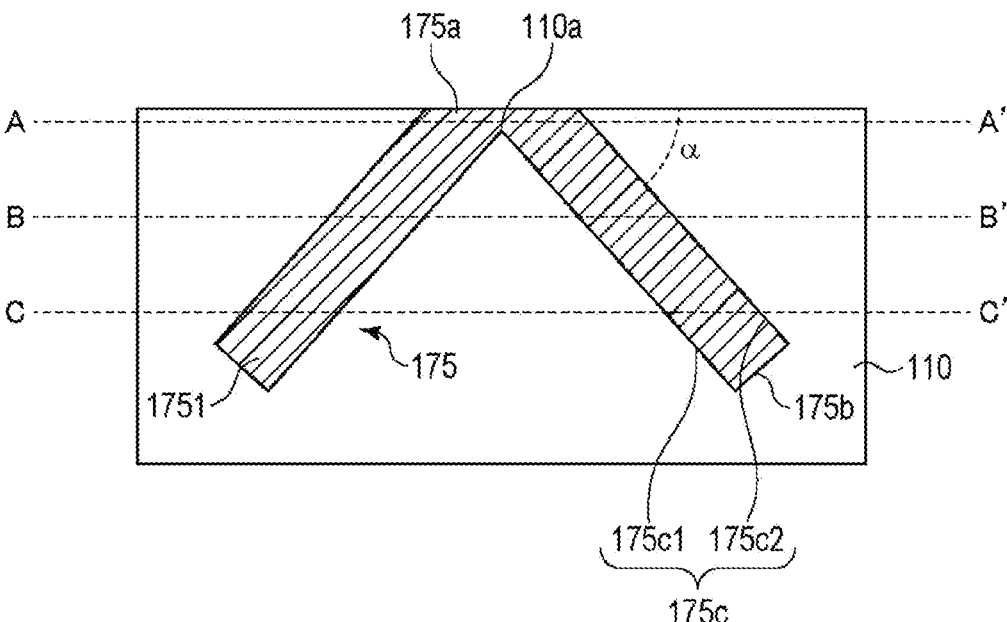
FIG. 17 is a cross-sectional view of the concavo-convex structure according to the sixth embodiment.
Figure 18A:
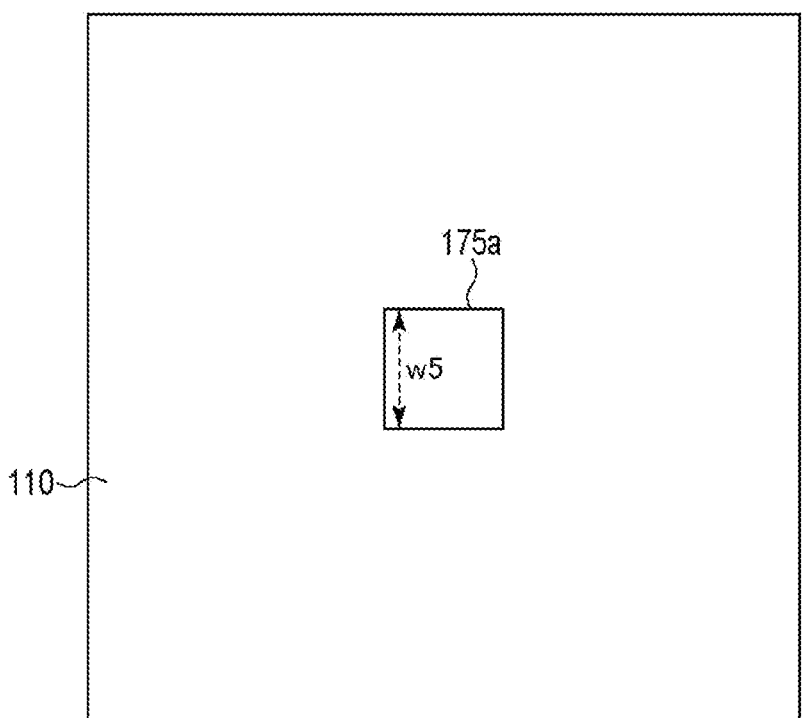
FIG. 18A is a plan view of the concavo-convex structure according to the sixth embodiment on the line A-A'.
Figure 18B:
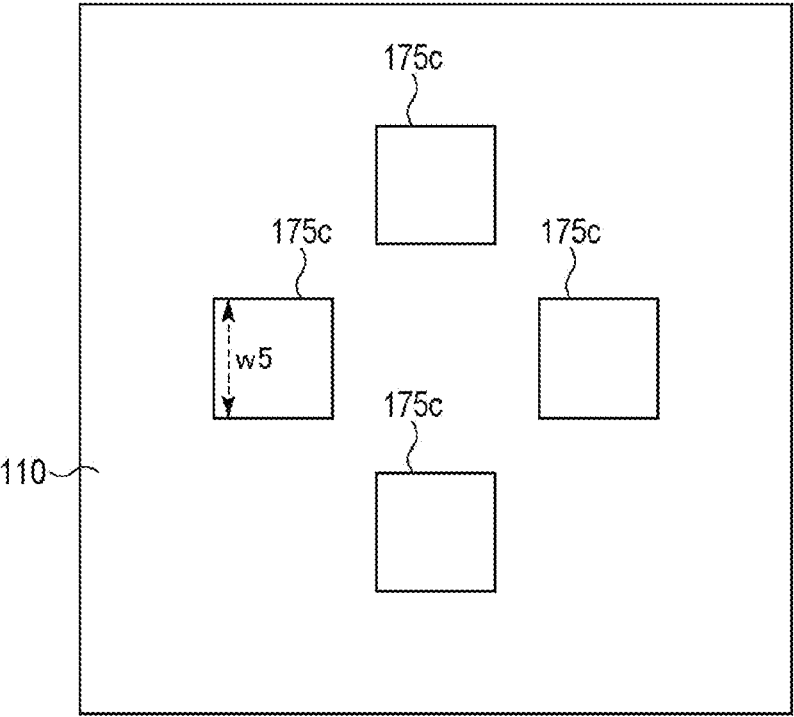
FIG. 18B is a plan view of the concavo-convex structure according to the sixth embodiment on the line B-B'.
Figure 18C:
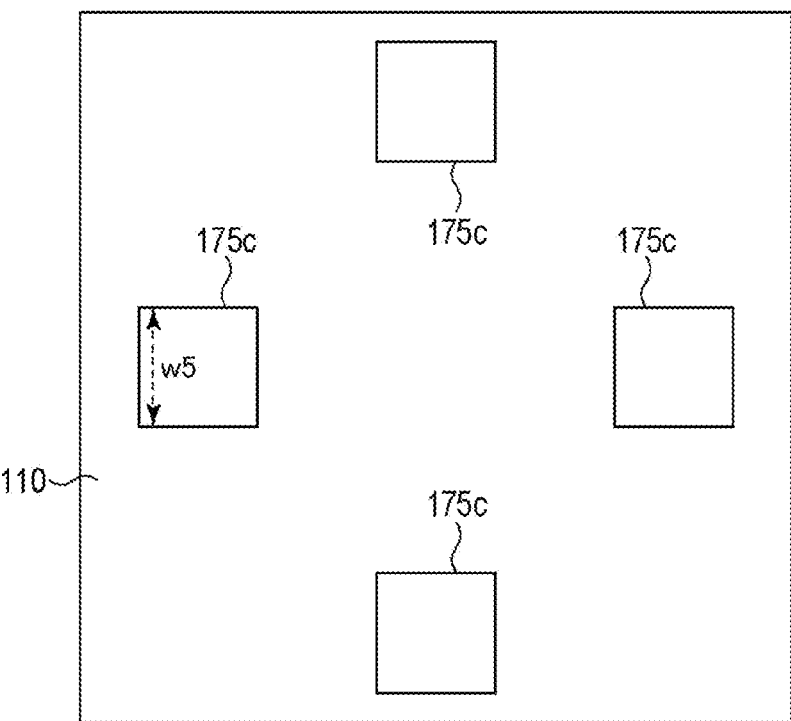
FIG. 18C is a plan view of the concavo-convex structure according to the sixth embodiment on the line C-C'.

The sixth embodiment of the present disclosure will be described. FIG. 17 is a cross-sectional view of the concavo-convex structure of the present embodiment. FIGS. 18A to 18C are plan views of the concavo-convex structure of FIG. 17 taken along lines A-A', B-B', and C-C', respectively.

The concavo-convex structure 170 includes a trench 175 obliquely extending from the light receiving surface of the semiconductor layer 110 to the inside of the semiconductor layer 110, and the trench 175 includes an opening 175a, a bottom 175b, and an intermediate portion 175c. A filling member 1751 is formed in the trench 175. In the present embodiment, unlike the fifth embodiment, the four intermediate portions 175c share the one opening 175a. The shape of the intermediate portion 175c corresponds to the shape of the opening 175a and has a rectangular shape having a width w5. The shape of the intermediate portion 175c is constant regardless of the depth of the intermediate portion 175c. On the other hand, the four intermediate portions 175c are separated from each other as the four intermediate portions 175c extend deep from the light receiving surface.

Also in the present embodiment, the trench 175 extends obliquely from the light receiving surface of the semiconductor layer 110 to the inside of the semiconductor layer 110. Thus, the light absorption efficiency in the semiconductor layer 110 can be enhanced and the sensitivity can be improved. The number of intermediate portions 175c is not limited to four, and more intermediate portions 175c may share the one opening 175a.

Seventh Embodiment

Figure 19A:
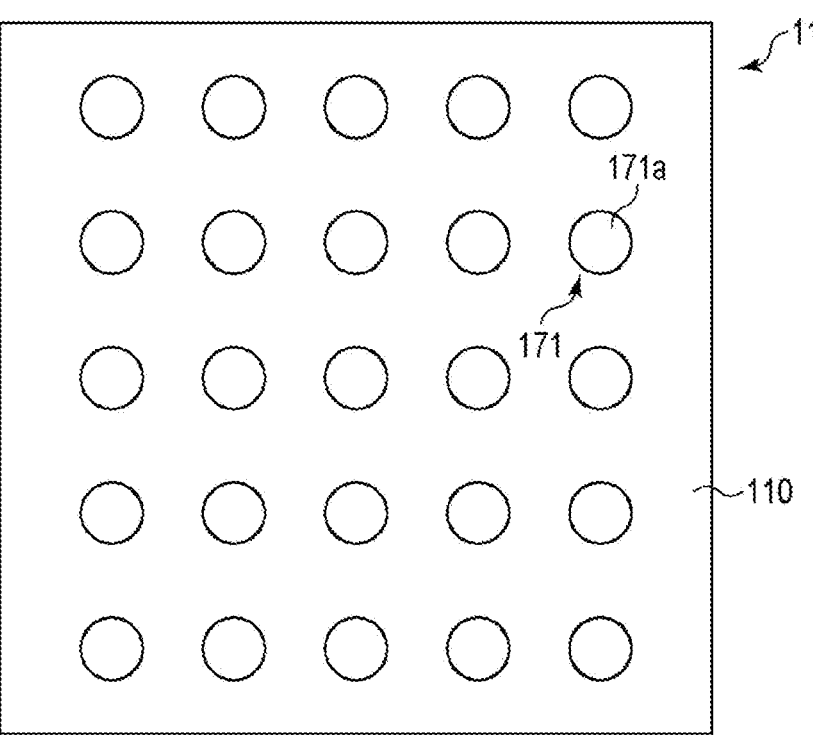
FIG. 19A is a plan view of the concavo-convex structure according to the seventh embodiment.
Figure 19B:
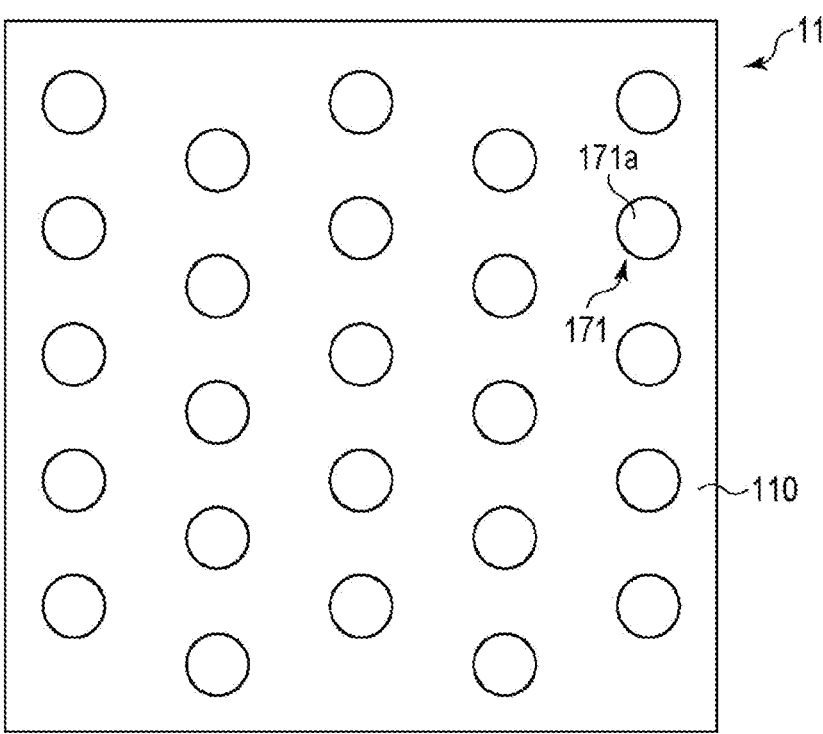
FIG. 19B is a plan view of the concavo-convex structure according to the seventh embodiment.
Figure 19C:
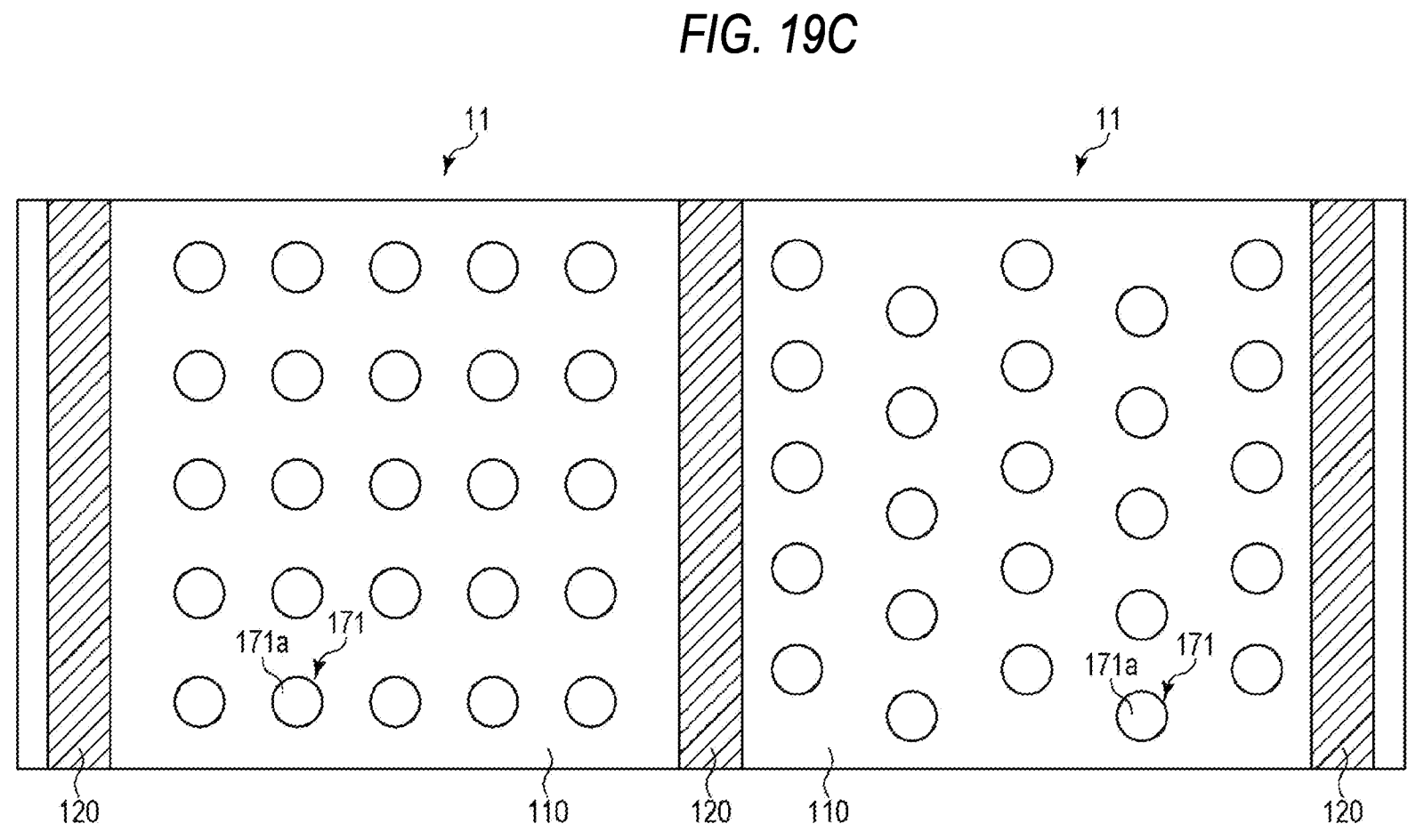

The trenches according to the first to the sixth embodiments described above can be arranged in any pattern on the light receiving surface of the semiconductor layer 110 including the APD 11. For example, as shown in FIG. 19A, the plurality of trenches 171 including the openings 171a according to the first embodiment can be arranged at equal intervals in the row and column directions of the light receiving surface of the semiconductor layer 110 in plan view. Also, as shown in FIG. 19B, the plurality of trenches 171 may be arranged in a staggered manner in the row or column direction to have a houndstooth shape in plan view. The patterns of trenches 171 may be different for each pixel. For example, as shown in FIG. 19C, the plurality of trenches 171 may be arranged according to the pattern of FIG. 19A in one of the two pixels separated by the pixel isolation portion 120, and the plurality of trenches 171 may be arranged according to the pattern of FIG. 19B in the other of the two pixels. The trenches do not necessarily have to be arranged in a regular pattern, but may be arranged randomly.

Eighth Embodiment

Figure 20:
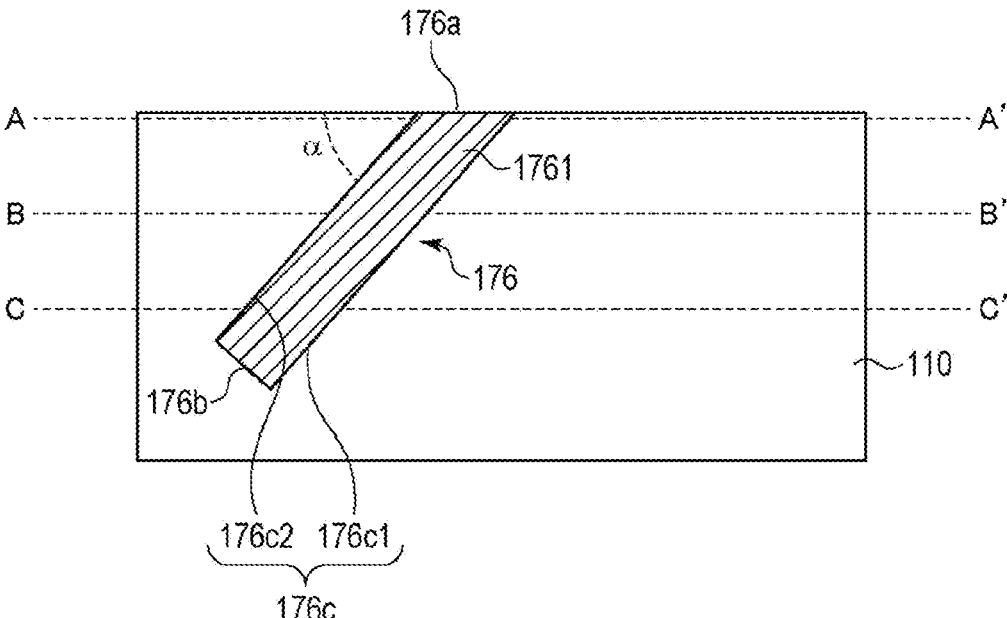
FIG. 20 is a cross-sectional view of the concavo-convex structure according to the eighth embodiment.
Figure 21A:
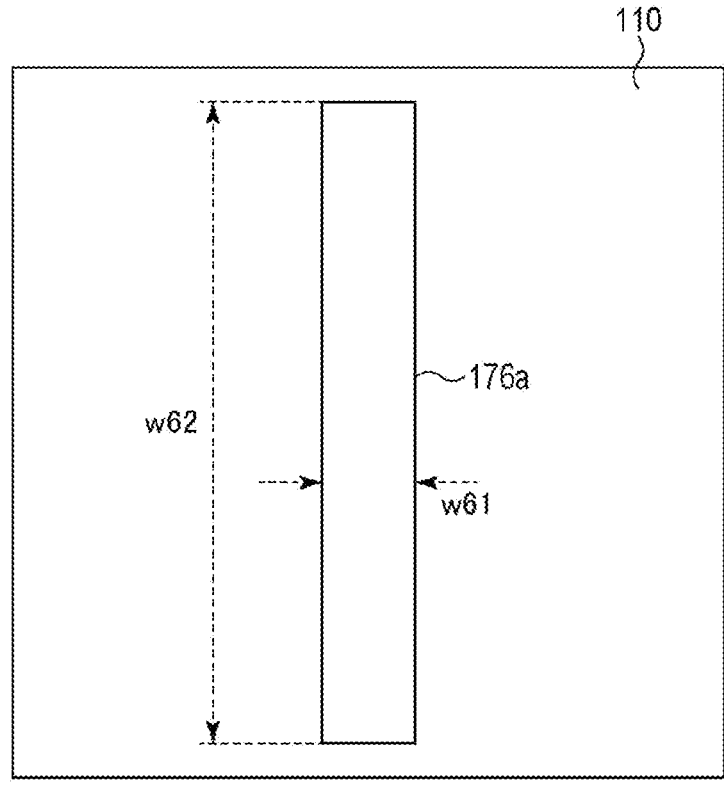
FIG. 21A is a plan view of the concavo-convex structure according to the eighth embodiment on the line A-A'.
Figure 21B:
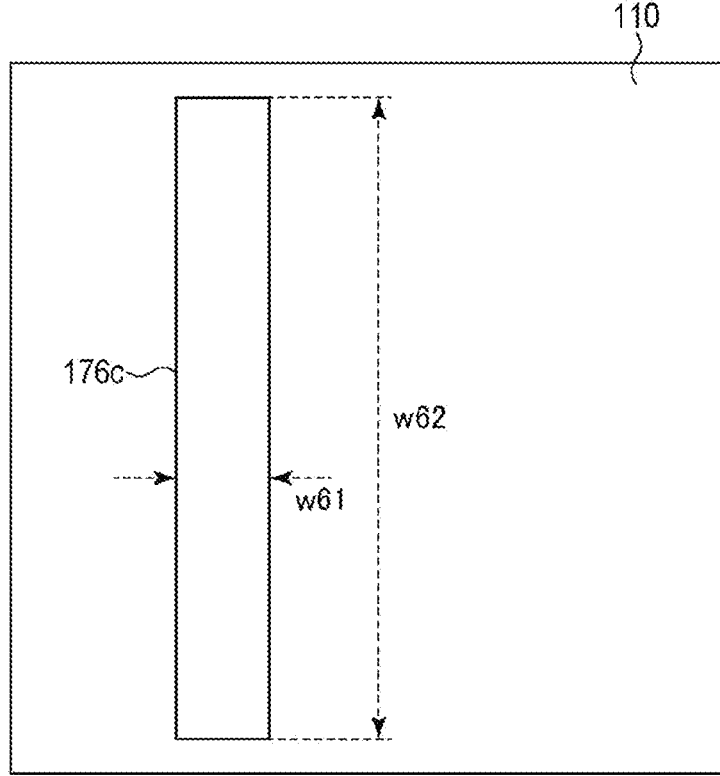
FIG. 21B is a plan view of the concavo-convex structure according to the eighth embodiment on the line B-B'.
Figure 21C:
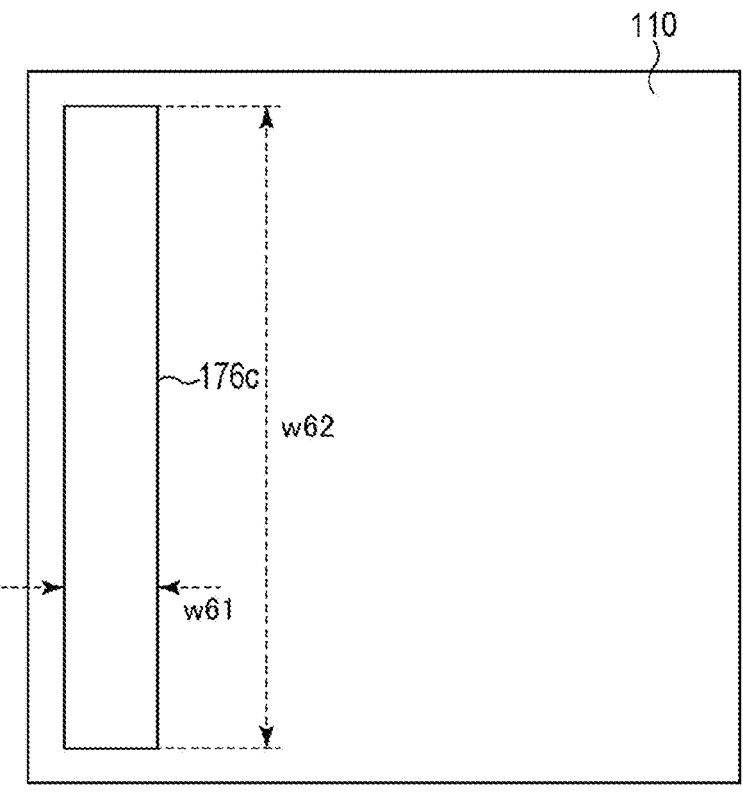
FIG. 21C is a plan view of the concavo-convex structure according to the eighth embodiment on the line C-C'.

The eighth embodiment of the present disclosure will be described. FIG. 20 is a cross-sectional view of the concavo-convex structure of the present embodiment. FIGS. 21A to 21C are plan views of the concavo-convex structure of FIG. 20 taken along lines A-A', B-B', and C-C', respectively.

The concavo-convex structure 170 includes a trench 176 obliquely extending from the light receiving surface of the semiconductor layer 110 to the inside of the semiconductor layer 110, and the trench 176 includes an opening 176a, a bottom 176b, and an intermediate portion 176c. A filling member 1761 is formed in the trench 176. In the plan view of FIG. 21A, the opening 176a has an elongated shape having widths w61 and w62. The width w61 is, for example, 0.2 μm or less, and preferably 0.1 μm or less. The width w62 of the opening 176a is larger than the width w61 and may correspond to, for example, the width of a pixel. In the plan view of FIGS. 21B and 21C, the shape of the intermediate portion 176c of the trench 176 corresponds to the shape of the opening 176a and has the widths w61 and w62. The shape of the intermediate portion 176c is constant regardless of the depth of the intermediate portion 176c. The shape of the opening 176a may be an ellipse or a polygon other than a rectangle.

Figure 22A:
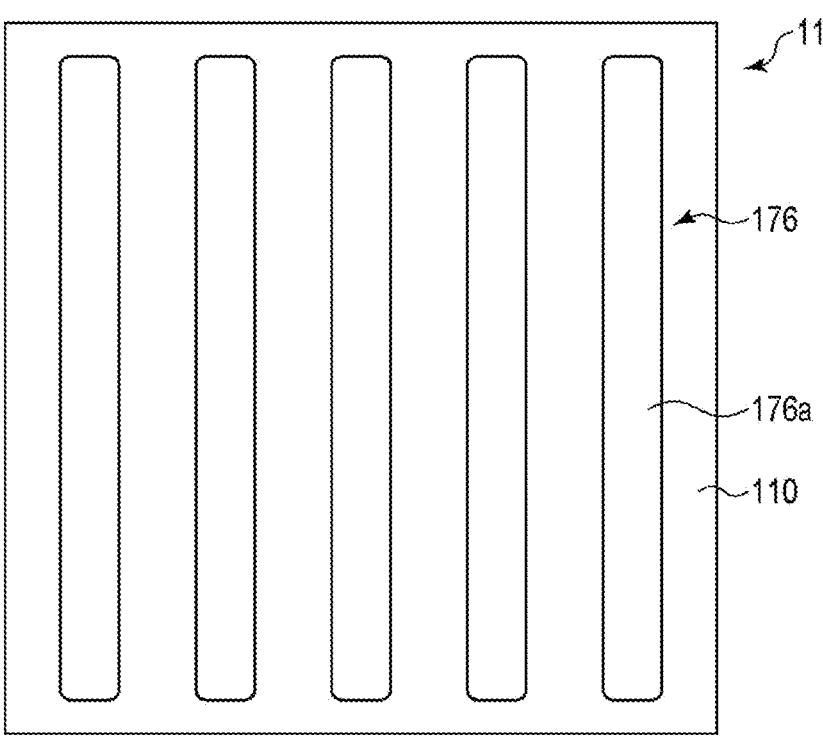
FIG. 22A is a plan view of the concavo-convex structure according to the eighth embodiment.
Figure 22B:
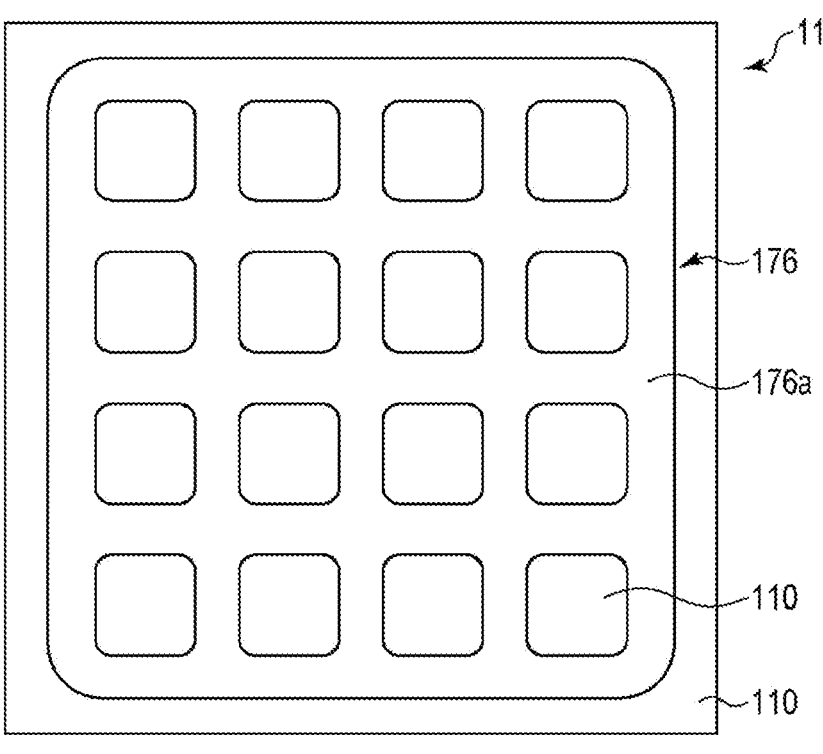
FIG. 22B is a plan view of the concavo-convex structure according to the eighth embodiment.

The trenches according to the present embodiment may be arranged in any pattern on the light receiving surface of the semiconductor layer 110. For example, as shown in FIG. 22A, the multiple trenches 176 can be arranged in the column direction of the light receiving surface of the semiconductor layer 110 in plan view. Further, for example, as shown in FIG. 22B, the multiple trenches 176 can be arranged in a grid shape in the row and column directions of the light receiving surface of the semiconductor layer 110 in a plan view.

Ninth Embodiment

Figure 23:
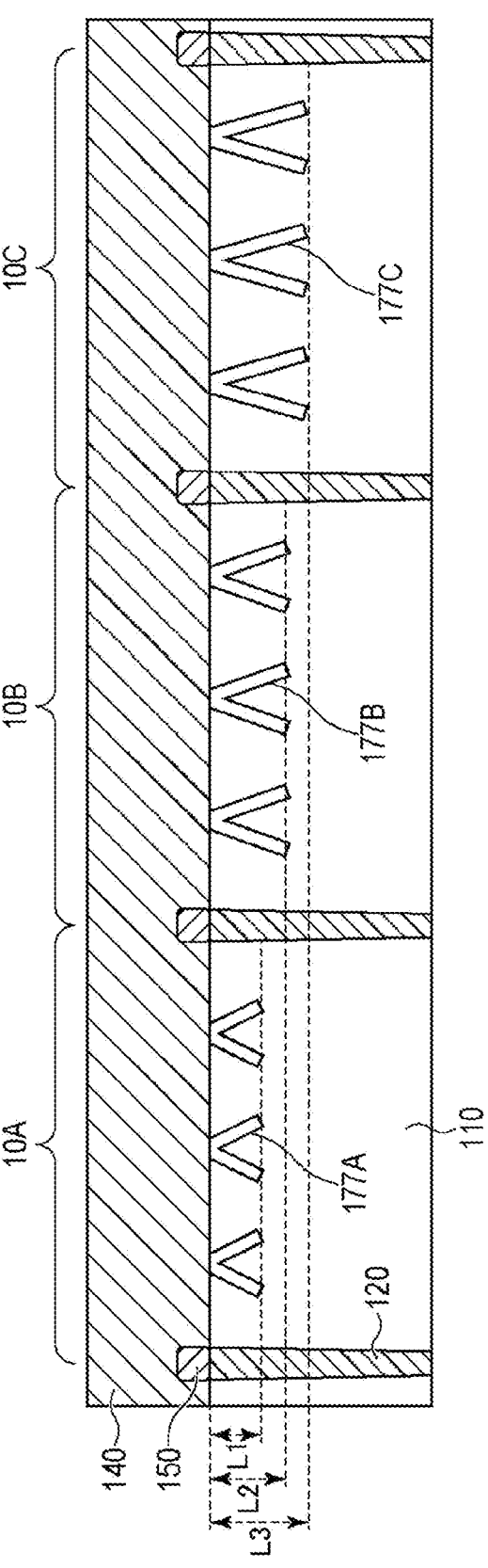
FIG. 23 is a cross-sectional view of the photoelectric conversion apparatus according to the ninth embodiment.

The ninth embodiment of the present disclosure will be described. The trenches shown in the above embodiments may be arranged in a different pattern for each pixel. FIG. 23 is a cross-sectional view of the concavo-convex structure of the present embodiment. Each of pixels 10A, 10B and 10C has the semiconductor layer 110 and the insulating layer 140. The pixel isolation portion 120 is formed between the pixels 10A, 10B and 10C. The light shielding portion 150 is formed between the pixel isolation portion 120 and the insulating layer 140.

The light receiving surfaces of the pixels 10A, 10B, and 10C are formed with trenches 177A, 177B, and 177C according to the present disclosure, respectively. The trenches 177A, 177B, and 177C have trench lengths L1, L2, and L3, respectively, in a cross-sectional view. The trench length L2 is greater than the trench length L1, and the trench length L3 is greater than the trench lengths L1, L2. By changing the depth to which the trenches are formed for each pixel as described in the present embodiment, the light absorption efficiency can be optimized for each pixel according to the wavelength band of incident light and the material of the member filled in the trenches 177A, 177B and 177C.

Tenth Embodiment

Figure 24:
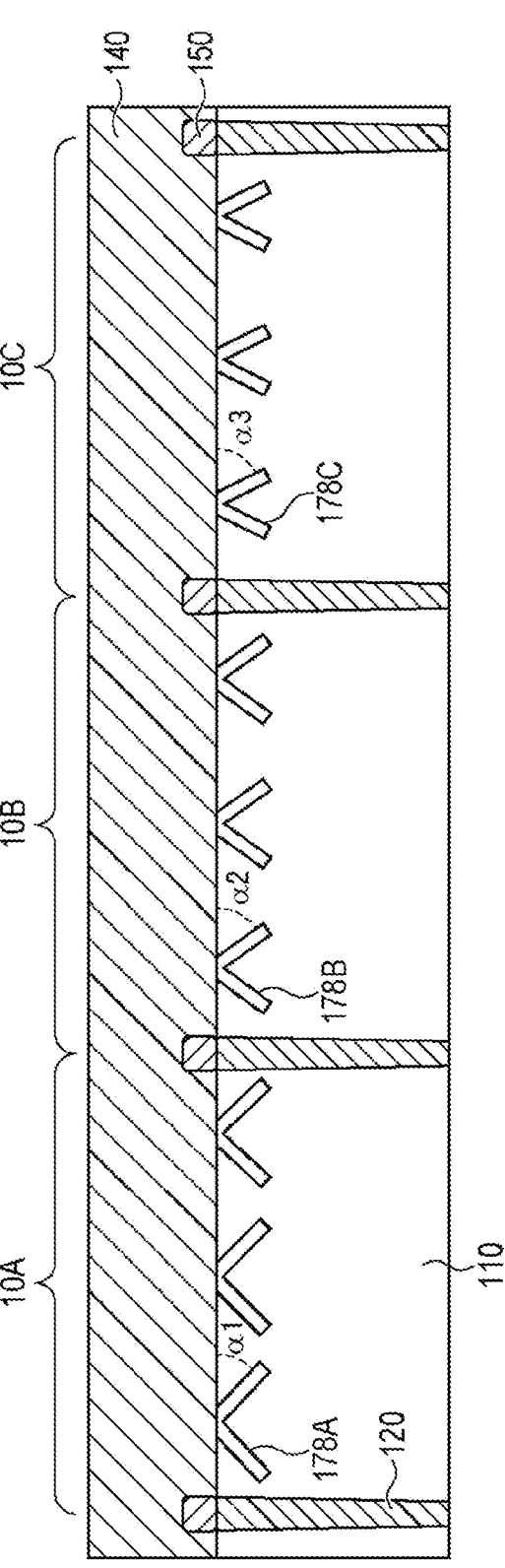
FIG. 24 is a cross-sectional view of the concavo-convex structure according to the tenth embodiment.

The tenth embodiment according to the present disclosure will be described. FIG. 24 is a cross-sectional view of the concavo-convex structure of the present embodiment. Each of pixels 10A, 10B and 10C has the semiconductor layer 110 and the insulating layer 140. The pixel isolation portion 120 is formed between the pixels 10A, and 10C. The light shielding portion 150 is formed between the pixel isolation portion 120 and the insulating layer 140.

The light receiving surfaces of the pixels 10A, 10B, and 10C are formed with trenches 178A, 178B, and 178C according to the present disclosure, respectively. The trenches 178A, 178B, and 178C extend to form angles α1, α2, and α3 with the light receiving surface of the semiconductor layer 110, respectively. The angle α2 is greater than the angle α1, and the angle α3 is greater than the angles α1, α2. By changing the angle between the trench and the light receiving surface for each pixel as described in the present embodiment, the light absorption efficiency can be optimized for each pixel according to the wavelength band of incident light and the material of the member filled in the trenches 178A, 178B and 178C.

Eleventh Embodiment

The eleventh embodiment of the present disclosure will be described. FIG. is a cross-sectional view of the concavo-convex structure of the present embodiment. Each of the pixels 10A, 10B and 10C has the semiconductor layer 110 and the insulating layer 140. The pixel isolation portion 120 is formed between the pixels 10A, 10B and 10C. The light shielding portion 150 is formed between the pixel isolation portion 120 and the insulating layer 140.

The light receiving surfaces of the pixels 10A, 10B, and 10C are formed with trenches 179 according to the present disclosure. The pixel 10C includes more trenches 179 than the pixels 10A, 10B. Further, the pixel 10A includes more trenches 179 than the pixel 10B. By changing the number of trenches to be formed for each pixel as described in the present embodiment, the light absorption efficiency can be optimized for each pixel according to the wavelength band of incident light and the material of the member to be filled in the trench 179.

Figure 25:
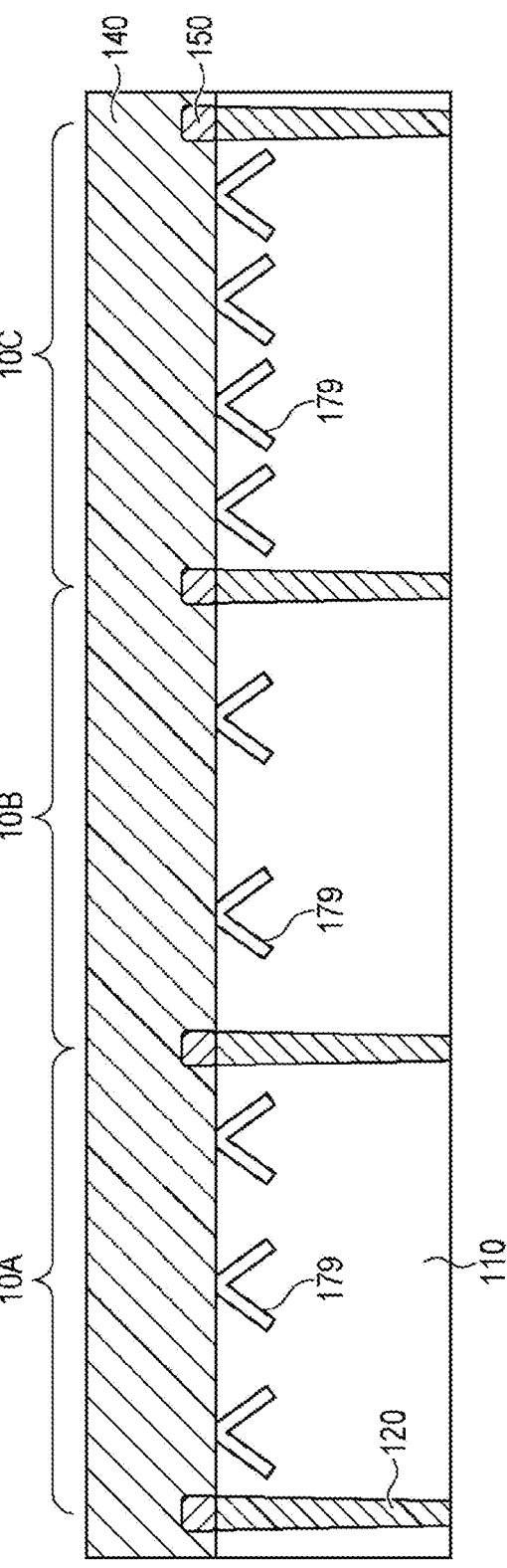
FIG. 25 is a cross-sectional view of the concavo-convex structure according to the eleventh embodiment.
Figure 26:
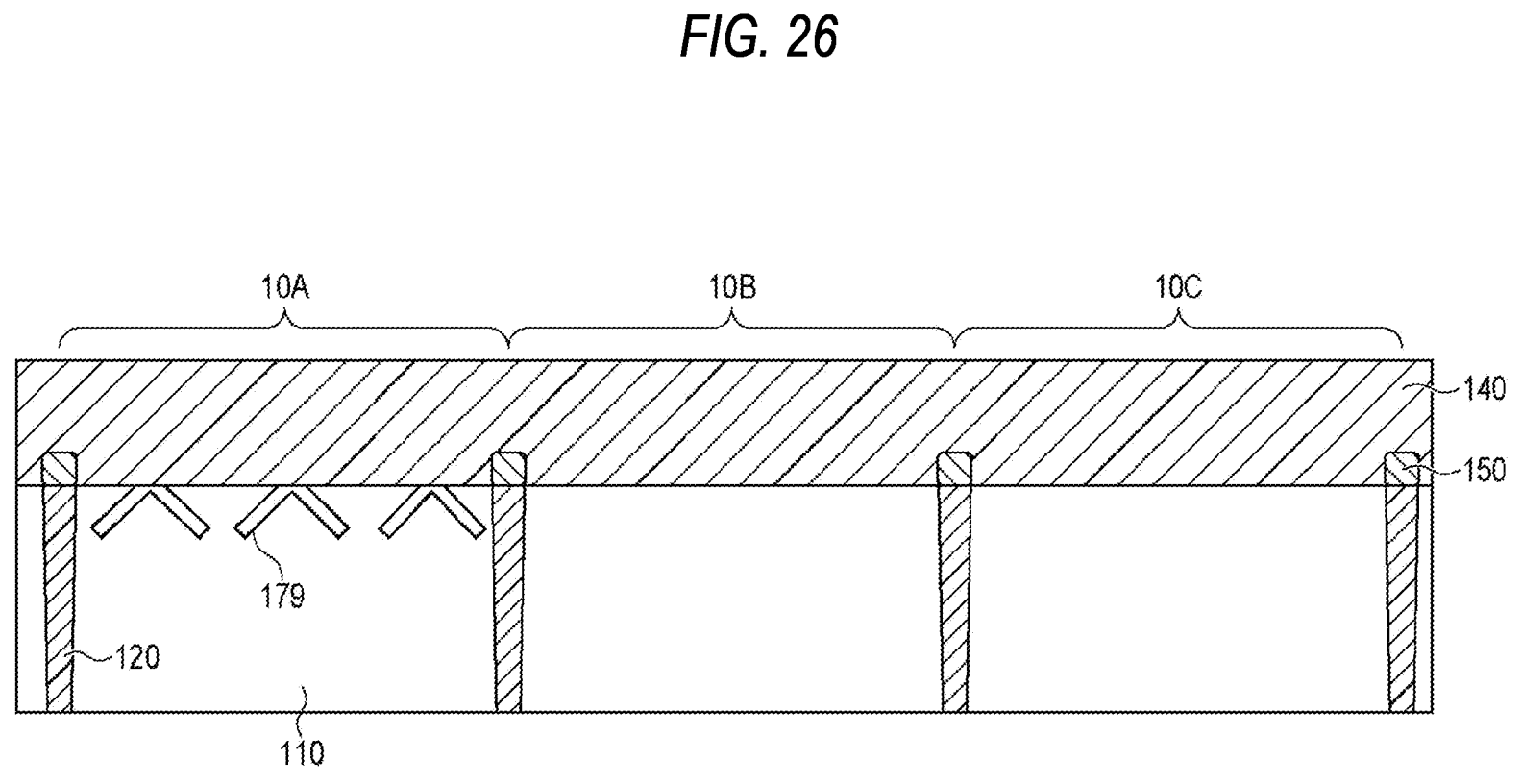

In the example shown in FIG. 25, the trenches 179 are formed on the light receiving surfaces of the pixels 10A, 10B, and 10C. As shown in FIG. 26, for example, however, the trenches 179 may be formed only on the surface of the first surface side of the semiconductor layer 110 of the pixel 10A. In the example shown in FIG. 26, the pixel can be a pixel for detecting light with a long wavelength band having a relatively low light absorption efficiency.

Twelfth Embodiment

Figure 27:
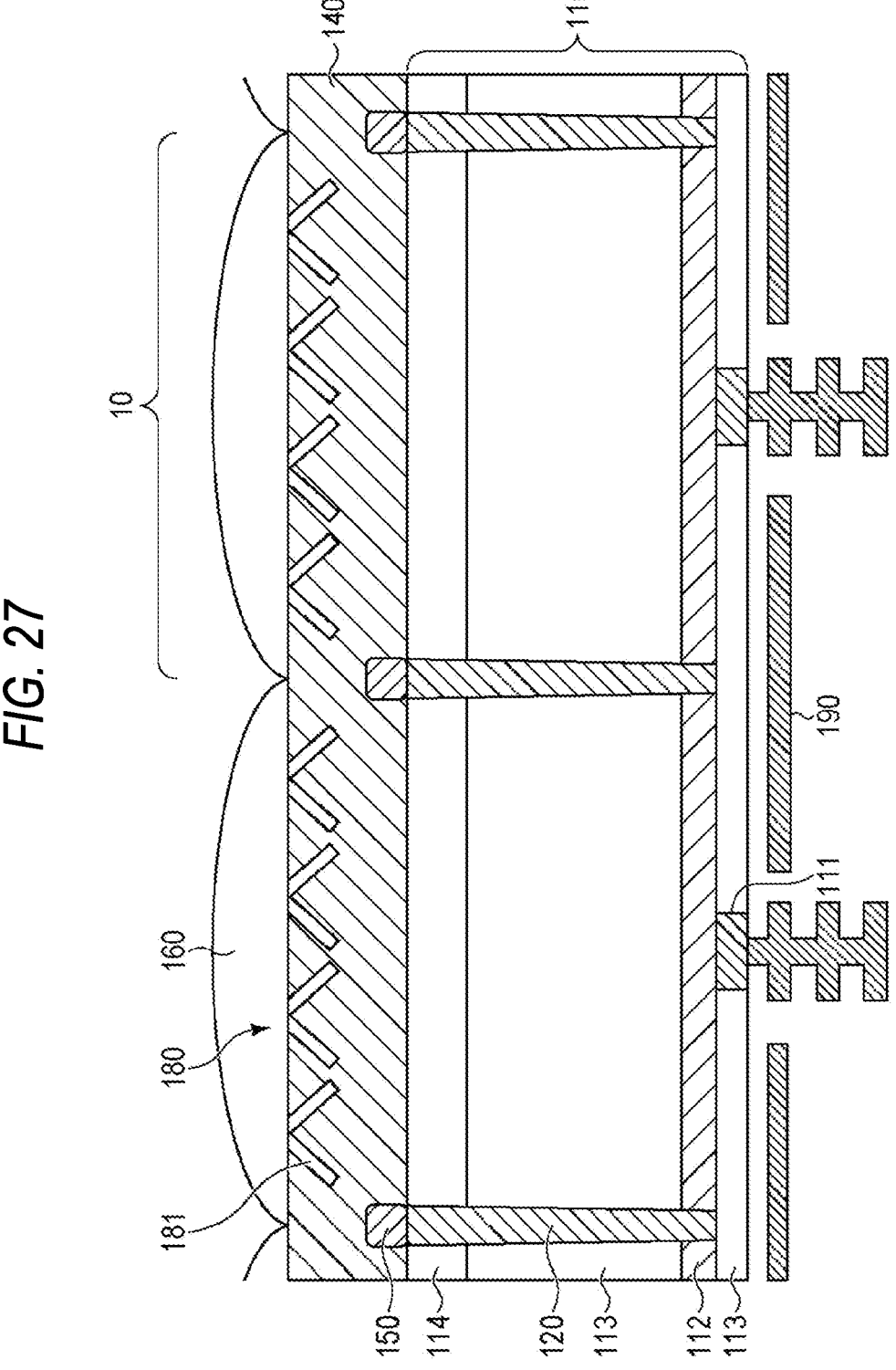
FIG. 27 is a cross-sectional view of a plurality of adjacent pixels according to the twelfth embodiment.

In the above embodiments, the trenches are formed in the semiconductor layer 110. However, the trenches do not necessarily have to be formed in the semiconductor layer 110. FIG. 27 is a cross-sectional view of multiple adjacent pixels in the present embodiment. As shown in FIG. 27, the pixel 10 includes the semiconductor layer 110 and the insulating layer 140. A concavo-convex structure 180 including trenches 181 is formed on the surface of the insulating layer 140 on the side where light enters. The shape of the trench 181, the member to be filled in the trench 181, the optical characteristics and the like may be similar to any of the trenches 171 to 179 described above. The configuration according to the present embodiment also allows to enhance the absorption efficiency of incident light and improve the sensitivity.

Thirteenth Embodiment

Figure 28:
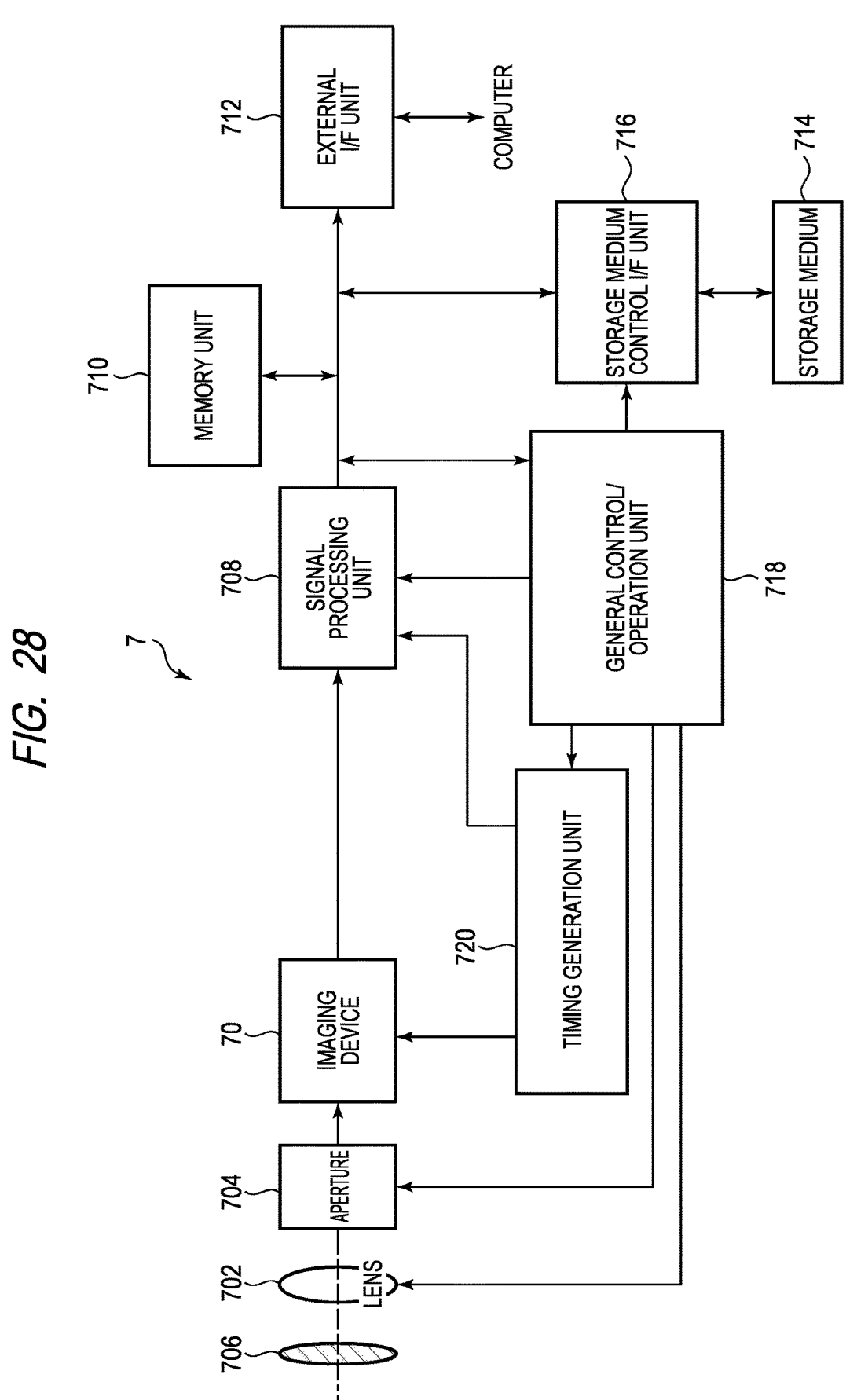
FIG. 28 is a block diagram of a photodetection system according to the thirteenth embodiment.

An imaging system according to the thirteenth embodiment of the present disclosure will be described with reference to FIG. 28. FIG. 28 is a block diagram of a photodetection system according to the present embodiment. The photodetection system according to the present embodiment is an imaging system that acquires an image based on incident light. The photoelectric conversion device in the above-described embodiments can be applied to various imaging systems. Examples of the imaging system include a digital still camera, a digital camcorder, a camera head, a copier, a fax machine, a cellular phone, an in-vehicle camera, an observation satellite, and a surveillance camera. FIG. 28 is a block diagram of a digital still camera as an example of an imaging system.

An imaging system 7 illustrated in FIG. 28 includes a barrier 706, a lens 702, an aperture 704, an imaging device 70, a signal processing unit 708, a timing generation unit 720, a general control/operation unit 718, a memory unit 710, a storage medium control I/F unit 716, a storage medium 714, and an external I/F unit 712. The barrier 706 protects the lens, and the lens 702 forms an optical image of an object on the imaging device 70. The aperture 704 varies the amount of light passing through the lens 702. The imaging device 70 is configured like the photoelectric conversion device of the above embodiments, and converts an optical image formed by the lens 702 into image data. The signal processing unit 708 performs a process such as compression and various corrections of data on the imaging data output from the imaging device 70.

The timing generation unit 720 outputs various timing signals to the imaging device 70 and the signal processing unit 708. The general control/operation unit 718 controls the overall digital still camera, and the memory unit 710 temporarily stores image data. The storage medium control I/F unit 716 is an interface for recording or reading image data in or from the storage medium 714, and the storage medium 714 is a removable storage medium such as a semiconductor memory for recording or reading image data. The external I/F unit 712 is an interface for communicating with an external computer or the like. The timing signal or the like may be input from the outside of the imaging system 7, and the imaging system 7 may include at least the imaging device 70 and the signal processing unit 708 that processes the image signal output from the imaging device 70.

In the present embodiment, the imaging device 70 and the signal processing unit 708 are formed on different semiconductor substrates. However, the imaging device and the signal processing unit 708 may be formed on the same semiconductor substrate.

Each pixel of the imaging device 70 may include a first photoelectric conversion unit and a second photoelectric conversion unit. The signal processing unit 708 may process the pixel signal based on the charge generated in the first photoelectric conversion unit and the pixel signal based on the charge generated in the second photoelectric conversion unit, and acquire the distance information from the imaging device 70 to the object.

Fourteenth Embodiment

Figure 29:
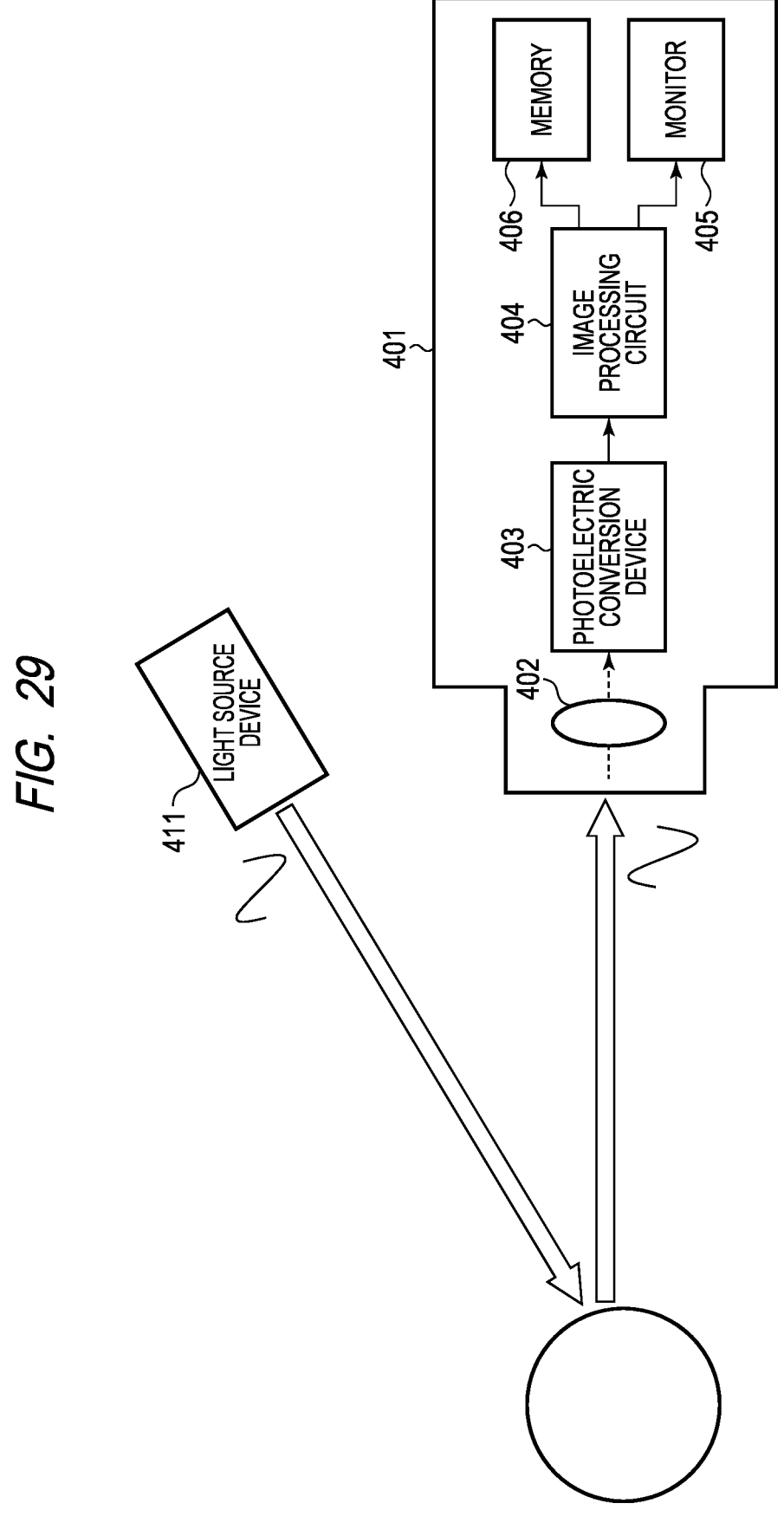
FIG. 29 is a block diagram of a photodetection system according to the fourteenth embodiment.

FIG. 29 is a block diagram of a photodetection system according to the present embodiment. More specifically, FIG. 29 is a block diagram of a ranging image sensor using the photoelectric conversion device according to the above-described embodiments.

As illustrated in FIG. 29, a ranging image sensor 401 includes an optical system 402, a photoelectric conversion device 403, an image processing circuit 404, a monitor 405, and a memory 406. The ranging image sensor 401 receives light (modulated light, pulsed light) emitted from a light source device 411 toward an object and reflected by the surface of the object. The ranging image sensor 401 can acquire a distance image corresponding to the distance to the object based on the time from light emission to light reception.

The optical system 402 includes one or a plurality of lenses, guides image light (incident light) from the object to the photoelectric conversion device 403, and forms an image on a light receiving surface (sensor portion) of the photoelectric conversion device 403.

As the photoelectric conversion device 403, the photoelectric conversion device of each of the above embodiments can be applied. The photoelectric conversion device 403 supplies a distance signal indicating a distance obtained from the received light signal to the image processing circuit 404.

The image processing circuit 404 performs image processing for forming a distance image based on the distance signal supplied from the photoelectric conversion device 403. The distance image (image data) obtained by image processing can be displayed on the monitor 405 and stored (recorded) in the memory 406.

By applying the photoelectric conversion device described above to the ranging image sensor 401 configured as described above, a more accurate distance image can be acquired.

Fifteenth Embodiment

The technology according to the present disclosure can be applied to various products. For example, techniques according to the present disclosure may be applied to endoscope surgery systems which is an example of the photodetection system.

Figure 30:
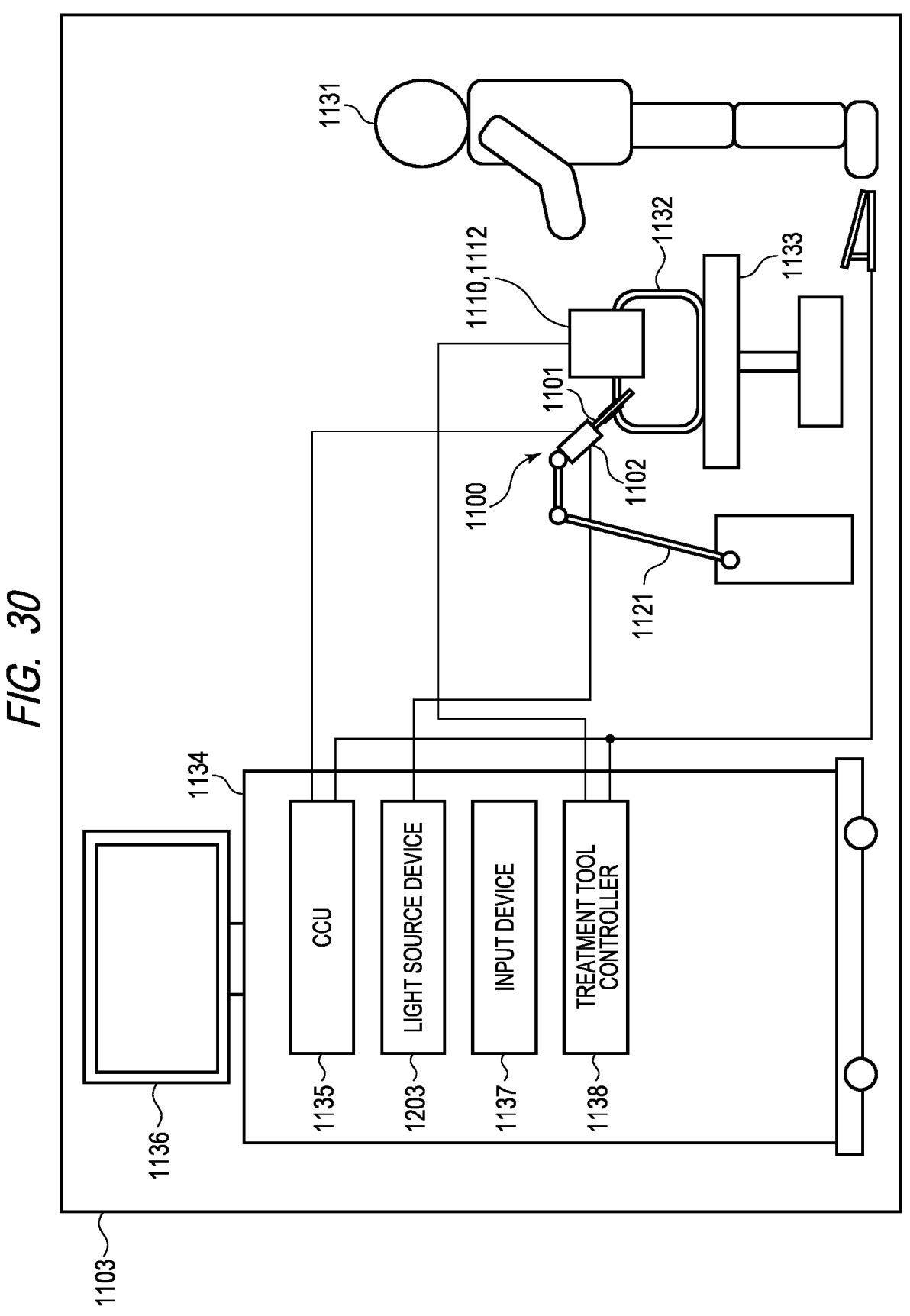
FIG. 30 is a schematic diagram of an endoscope surgery system according to the fifteenth embodiment.

FIG. 30 is a schematic view of an endoscope surgery system according to the present embodiment. FIG. 30 shows a state in which an operator (physician) 1131 performs surgery on a patient 1132 on a patient bed 1133 using an endoscope surgery system 1103. As shown, the endoscope surgery system 1103 includes an endoscope 1100, a surgery tool 1110, and a cart 1134 on which various devices for endoscopic surgery are mounted.

The endoscope 1100 includes a lens barrel 1101 in which an area of a predetermined length from the distal end is inserted into the body cavity of the patient 1132, a camera head 1102 connected to the proximal end of the lens barrel 1101, and an arm 1121. Although FIG. 30 illustrates the endoscope 1100 configured as a so-called rigid scope having the rigid lens barrel 1101, the endoscope 1100 may be configured as a so-called flexible scope having a flexible lens barrel.

An opening into which an objective lens is fitted is provided at a distal end of the lens barrel 1101. A light source device 1203 is connected to the endoscope 1100. Light generated by the light source device 1203 is guided to the distal end of the barrel by a light guide extended inside the lens barrel 1101, and is irradiated toward an observation target in the body cavity of the patient 1132 via an objective lens. The endoscope 1100 may be a straight-viewing scope an oblique-viewing scope, or a side-viewing scope.

An optical system and a photoelectric conversion device are provided inside the camera head 1102, and reflected light (observation light) from an observation target is focused on the photoelectric conversion device by the optical system. The observation light is photoelectrically converted by the photoelectric conversion device, and an electric signal corresponding to the observation light, that is, an image signal corresponding to the observation image is generated. As the photoelectric conversion device, the photoelectric conversion device described in each of the above embodiments can be used. The image signal is transmitted to a camera control unit (CCU) 1135 as RAW data.

The CCU 1135 includes a central processing unit (CPU), a graphics processing unit (GPU), and the like, and controls overall operations of the endoscope 1100 and a display device 1136. Further, the CCU 1135 receives an image signal from the camera head 1102, and performs various kinds of image processing for displaying an image based on the image signal, such as development processing (demosaic processing).

The display device 1136 displays an image based on the image signal subjected to the image processing by the CCU 1135 under the control of the CCU 1135.

The light source device 1203 includes, for example, a light source such as a light emitting diode (LED), and supplies irradiation light to the endoscope 1100 when capturing an image of an operating part or the like.

An input device 1137 is an input interface to the endoscope surgery system 1103. The user can input various types of information and input instructions to the endoscope surgery system 1103 via the input device 1137.

A treatment tool controller 1138 controls the actuation of an energy treatment tool 1112 for ablation of tissue, incision, sealing of blood vessels, etc.

The light source device 1203 is capable of supplying irradiation light to the endoscope 1100 when capturing an image of the surgical site, and may be, for example, a white light source formed by an LED, a laser light source, or a combination thereof. When a white light source is configured by a combination of RGB laser light sources, the output intensity and output timing of each color (each wavelength) can be controlled with high accuracy. Therefore, the white balance of the captured image can be adjusted in the light source device 1203. In this case, laser light from each of the RGB laser light sources may be irradiated onto the observation target in a time-division manner, and driving of the image pickup device of the camera head 1102 may be controlled in synchronization with the irradiation timing. Thus, images corresponding to R, G, and B can be captured in a time-division manner. According to this method, a color image can be obtained without providing a color filter in the image pickup device.

The driving of the light source device 1203 may be controlled such that the intensity of light output from the light source device 1203 is changed at predetermined time intervals. By controlling the driving of the image pickup device of the camera head 1102 in synchronization with the timing of changing the intensity of light to acquire an image in a time-division manner, and by synthesizing the images, it is possible to generate an image in a high dynamic range without so-called blackout and whiteout.

Further, the light source device 1203 may be configured to be able to supply light in a predetermined wavelength band corresponding to special light observation. In special light observation, for example, the wavelength dependence of light absorption in body tissue can be used. Specifically, a predetermined tissue such as a blood vessel in the surface layer of the mucosa is imaged with high contrast by irradiating light in a narrow band compared to the irradiation light (i.e., white light) during normal observation. Alternatively, in special light observation, fluorescence observation for obtaining an image by fluorescence generated by irradiation with excitation light may be performed. In the fluorescence observation, excitation light can be irradiated to the body tissue to observe fluorescence from the body tissue, or a reagent such as indocyanine green (ICG) can be locally injected into the body tissue and the body tissue can be irradiated with excitation light corresponding to the fluorescence wavelength of the reagent to obtain a fluorescence image. The light source device 1203 may be configured to be able to supply narrowband light and/or excitation light corresponding to such special light observation.

Sixteenth Embodiment

A light detection system and A movable body of the present embodiment will be described with reference to FIGS. 31, 32A, 32B, and 32C. In the present embodiment, an example of an in-vehicle camera is illustrated as a light detection system.

FIG. 31 is a schematic diagram of a light detection system according to the present embodiment, and illustrates an example of a vehicle system and a light detection system mounted on the vehicle system. A light detection system 1301 includes photoelectric conversion devices 1302, image pre-processing units 1315, an integrated circuit 1303, and optical systems 1314. The optical system 1314 forms an optical image of an object on the photoelectric conversion device 1302. The photoelectric conversion device 1302 converts the optical image of the object formed by the optical system 1314 into an electric signal. The photoelectric conversion device 1302 is the photoelectric conversion device of any one of the above-described embodiments. The image pre-processing unit 1315 performs predetermined signal processing on the signal output from the photoelectric conversion device 1302. The function of the image pre-processing unit 1315 may be incorporated in the photoelectric conversion device 1302. The light detection system 1301 is provided with at least two sets of the optical system 1314, the photoelectric conversion device 1302, and the image pre-processing unit 1315, and an output signal from the image pre-processing units 1315 of each set is input to the integrated circuit 1303.

The integrated circuit 1303 is an integrated circuit for use in an imaging system, and includes an image processing unit 1304 including a storage medium 1305, an optical ranging unit 1306, a parallax calculation unit 1307, an object recognition unit 1308, and an abnormality detection unit 1309. The image processing unit 1304 performs image processing such as development processing and defect correction on the output signal of the image pre-processing unit 1315. The storage medium 1305 performs primary storage of captured images and stores defect positions of image capturing pixels. The optical ranging unit 1306 focuses or measures the object. The parallax calculation unit 1307 calculates distance measurement information from the plurality of image data acquired by the plurality of photoelectric conversion devices 1302. The object recognition unit 1308 recognizes an object such as a car, a road, a sign, or a person. When the abnormality detection unit 1309 detects the abnormality of the photoelectric conversion device 1302, the abnormality detection unit 1309 issues an abnormality to a main control unit 1313.

The integrated circuit 1303 may be realized by dedicated hardware, a software module, or a combination thereof. It may be realized by a field programmable gate array (FPGA), an application specific integrated circuit (ASIC), or the like, or may be realized by a combination of these.

The main control unit 1313 (movable body controller) controls overall operations of the light detection system 1301, a vehicle sensor 1310, a control unit 1320, and the like. Without the main control unit 1313, the light detection system 1301, the vehicle sensor 1310, and the control unit 1320 may individually have a communication interface, and each of them may transmit and receive control signals via a communication network, for example, according to the CAN standard.

The integrated circuit 1303 has a function of transmitting a control signal or a setting value to the photoelectric conversion device 1302 by receiving a control signal from the main control unit 1313 or by its own control unit.

The light detection system 1301 is connected to the vehicle sensor 1310, and can detect a traveling state of the host vehicle such as a vehicle speed, a yaw rate, a steering angle, and the like, an environment outside the host vehicle, and states of other vehicles and obstacles. The vehicle sensor 1310 is also a distance information acquisition unit that acquires distance information to the object. The light detection system 1301 is connected to a driving support control unit 1311 that performs various driving support functions such as an automatic steering function, an automatic cruise function, and a collision prevention function. In particular, with regard to the collision determination function, based on detection results of the light detection system 1301 and the vehicle sensor 1310, it is determined whether or not there is a possibility or occurrence of collision with another vehicle or an obstacle. Thus, avoidance control is performed when a possibility of collision is estimated and a safety device is activated when collision occurs.

The light detection system 1301 is also connected to an alert device 1312 that issues an alarm to a driver based on a determination result of the collision determination unit. For example, when the possibility of collision is high as the determination result of the collision determination unit, the main control unit 1313 performs vehicle control such as braking, returning an accelerator, suppressing engine output, or the like, thereby avoiding collision or reducing damage. The alert device 1312 issues a warning to a user using means such as an alarm of a sound or the like, a display of alarm information on a display unit screen such as a car navigation system and a meter panel, and a vibration application to a seatbelt and a steering wheel.

Figure 32A:
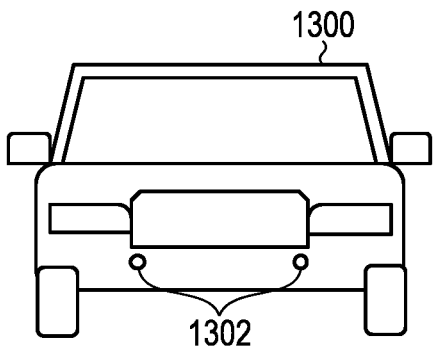
FIG. 32A is a schematic diagram of a movable body according to the sixteenth embodiment.
Figure 32B:
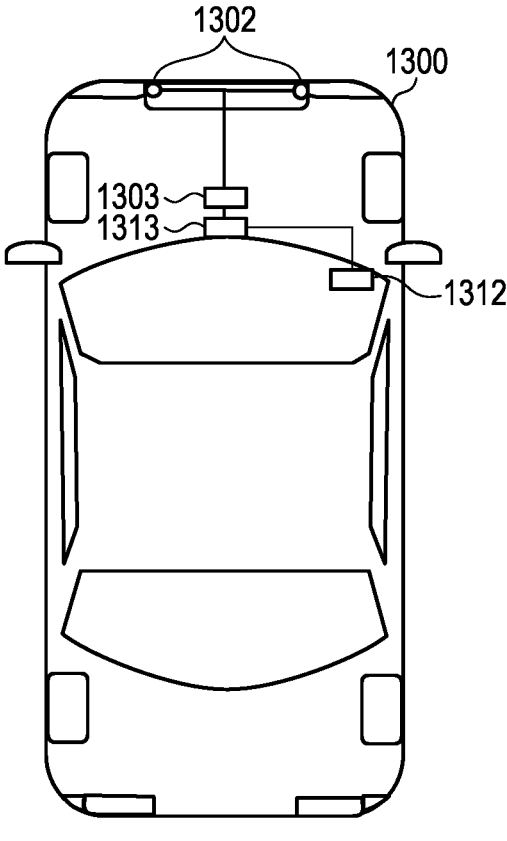
FIG. 32B is a schematic diagram of a movable body according to the sixteenth embodiment.
Figure 32C:
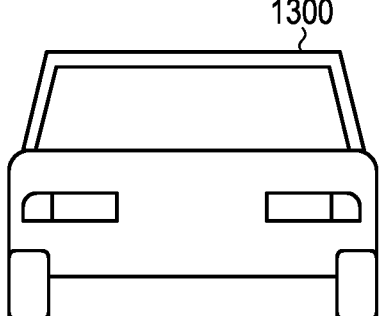
FIG. 32C is a schematic diagram of a movable body according to the sixteenth embodiment.

The light detection system 1301 according to the present embodiment can capture an image around the vehicle, for example, the front or the rear. FIGS. 32A, 32B, and 32C are schematic diagrams of a movable body according to the present embodiment, and illustrate a configuration in which an image of the front of the vehicle is captured by the light detection system 1301.

The two photoelectric conversion devices 1302 are arranged in front of a vehicle 1300. Specifically, it is preferable that a center line with respect to a forward/backward direction or an outer shape (for example, a vehicle width) of the vehicle 1300 be regarded as a symmetry axis, and the two photoelectric conversion devices 1302 be arranged in line symmetry with respect to the symmetry axis. This makes it possible to effectively acquire distance information between the vehicle 1300 and the object to be imaged and determine the possibility of collision. Further, it is preferable that the photoelectric conversion device 1302 be arranged at a position where it does not obstruct the field of view of the driver when the driver sees a situation outside the vehicle 1300 from the driver's seat. The alert device 1312 is preferably arranged at a position that is easy to enter the field of view of the driver.

Next, a failure detection operation of the photoelectric conversion device 1302 in the light detection system 1301 will be described with reference to FIG. 33. FIG. 33 is a flowchart illustrating an operation of the light detection system according to the present embodiment. The failure detection operation of the photoelectric conversion device 1302 may be performed according to steps S1410 to S1480 illustrated in FIG. 33.

In step S1410, the setting at the time of startup of the photoelectric conversion device 1302 is performed. That is, setting information for the operation of the photoelectric conversion device 1302 is transmitted from the outside of the light detection system 1301 (for example, the main control unit 1313) or the inside of the light detection system 1301, and the photoelectric conversion device 1302 starts an imaging operation and a failure detection operation.

Next, in step S1420, the photoelectric conversion device 1302 acquires pixel signals from the effective pixels. In step S1430, the photoelectric conversion device 1302 acquires an output value from a failure detection pixel provided for failure detection. The failure detection pixel includes a photoelectric conversion element in the same manner as the effective pixel. A predetermined voltage is written to the photoelectric conversion element. The failure detection pixel outputs a signal corresponding to the voltage written in the photoelectric conversion element. Steps S1420 and S1430 may be executed in reverse order.

Next, in step S1440, the light detection system 1301 performs a determination of correspondence between the expected output value of the failure detection pixel and the actual output value from the failure detection pixel. If it is determined in step S1440 that the expected output value matches the actual output value, the light detection system 1301 proceeds with the process to step S1450, determines that the imaging operation is normally performed, and proceeds with the process to step S1460. In step S1460, the light detection system 1301 transmits the pixel signals of the scanning row to the storage medium 1305 and temporarily stores them. Thereafter, the process of the light detection system 1301 returns to step S1420 to continue the failure detection operation. On the other hand, as a result of the determination in step S1440, if the expected output value does not match the actual output value, the light detection system 1301 proceeds with the process to step S1470. In step S1470, the light detection system 1301 determines that there is an abnormality in the imaging operation, and issues an alert to the main control unit 1313 or the alert device 1312. The alert device 1312 causes the display unit to display that an abnormality has been detected. Then, in step S1480, the light detection system 1301 stops the photoelectric conversion device 1302 and ends the operation of the light detection system 1301.

Although the present embodiment exemplifies the example in which the flowchart is looped for each row, the flowchart may be looped for each plurality of rows, or the failure detection operation may be performed for each frame. The alert of step S1470 may be notified to the outside of the vehicle via a wireless network.

Further, in the present embodiment, the control in which the vehicle does not collide with another vehicle has been described, but the present embodiment is also applicable to a control in which the vehicle is automatically driven following another vehicle, a control in which the vehicle is automatically driven so as not to protrude from the lane, and the like. Further, the light detection system 1301 can be applied not only to a vehicle such as a host vehicle, but also to a movable body (movable apparatus) such as a ship, an aircraft, or an industrial robot. In addition, the present embodiment can be applied not only to a movable body but also to an apparatus utilizing object recognition such as an intelligent transport systems (ITS). The photoelectric conversion device of the present disclosure may be a configuration capable of further acquiring various types of information such as distance information.

Seventeenth Embodiment

Figure 34A:
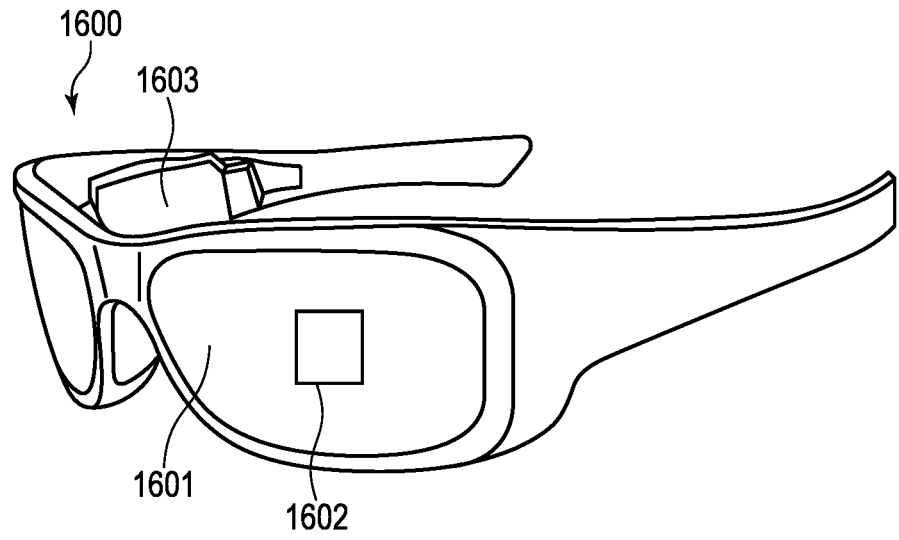
FIG. 34A is a diagram illustrating a specific example of an electronic device according to the seventeenth embodiment.

FIG. 34A is a diagram illustrating a specific example of an electronic device according to the present embodiment, and illustrates glasses 1600 (smart glasses). The glasses 1600 are provided with a photoelectric conversion device 1602 described in the above embodiments. That is, the glasses 1600 are an example of a light detection system to which the photoelectric conversion device 1602 described in each of the above embodiments can be applied. A display device including a light emitting device such as an OLED or an LED may be provided on the back surface side of a lens 1601. One photoelectric conversion device 1602 or the plurality of photoelectric conversion devices 1602 may be provided. Further, a plurality of types of photoelectric conversion devices may be combined. The arrangement position of the photoelectric conversion device 1602 is not limited to that illustrated in FIG. 34A.

The glasses 1600 further comprise a control device 1603. The control device 1603 functions as a power source for supplying power to the photoelectric conversion device 1602 and the above-described display device. The control device 1603 controls operations of the photoelectric conversion device 1602 and the display device. The lens 1601 is provided with an optical system for collecting light to the photoelectric conversion device 1602.

Figure 34B:
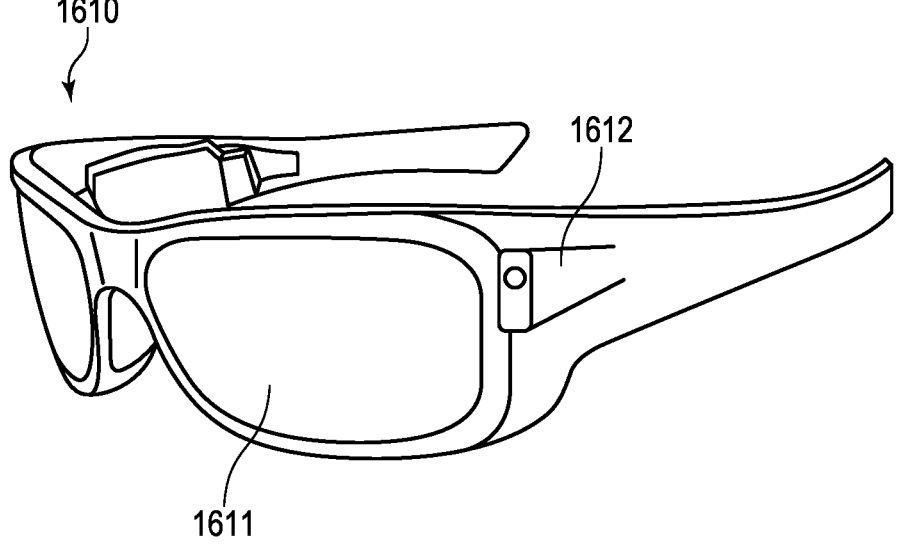
FIG. 34B is a diagram illustrating a specific example of an electronic device according to the seventeenth embodiment.

FIG. 34B illustrates glasses 1610 (smart glasses) according to one application. The glasses 1610 include a control device 1612, and a photoelectric conversion device corresponding to the photoelectric conversion device 1602 and a display device are mounted on the control device 1612. A lens 1611 is provided with a photoelectric conversion device in the control device 1612 and an optical system for projecting light emitted from a display device, and an image is projected on the lens 1611. The control device 1612 functions as a power source for supplying power to the photoelectric conversion device and the display device, and controls operations of the photoelectric conversion device and the display device. The control device 1612 may include a line-of-sight detection unit that detects the line of sight of the wearer. Infrared radiation may be used to detect the line of sight. The infrared light emitting unit emits infrared light to the eyeball of the user who is watching the display image. The reflected light of the emitted infrared light from the eyeball is detected by an imaging unit having a light receiving element, whereby a captured image of the eyeball is obtained. A reduction unit that reduces light from the infrared light emitting unit to the display unit in a plan view may be employed and the reduction unit reduces a degradation in image quality.

The control device 1612 detects the line of sight of the user with respect to the display image from the captured image of the eyeball obtained by imaging the infrared light. Any known method can be applied to the line-of-sight detection using the captured image of the eyeball. As an example, a line-of-sight detection method based on a Purkinje image due to reflection of irradiation light at a cornea can be used.

More specifically, a line-of-sight detection process based on a pupil cornea reflection method is performed. By using the pupil cornea reflection method, a line-of-sight vector representing a direction (rotation angle) of the eyeball is calculated based on the image of the pupil included in the captured image of the eyeball and the Purkinje image, whereby the line-of-sight of the user is detected.

The display device of the present embodiment may include a photoelectric conversion device having a light receiving element, and may control a display image of the display device based on line-of-sight information of the user from the photoelectric conversion device.

Specifically, the display device determines a first view field region gazed by the user and a second view field region other than the first view field region based on the line-of-sight information. The first view field region and the second view field region may be determined by a control device of the display device, or may be determined by an external control device. In the display area of the display device, the display resolution of the first view field region may be controlled to be higher than the display resolution of the second view field region. That is, the resolution of the second view field region may be lower than that of the first view field region.

The display area may include a first display region and a second display region different from the first display region. A region having a high priority may be determined from the first display region and the second display region based on the line-of-sight information. The first view field region and the second view field region may be determined by a control device of the display device, or may be determined by an external control device. The resolution of the high priority area may be controlled to be higher than the resolution of the region other than the high priority region. That is, the resolution of a region having a relatively low priority can be reduced.

It should be noted that an artificial intelligence (AI) may be used in determining the first view field region and the region with high priority. The AI may be a model configured to estimate an angle of a line of sight and a distance to a target on the line-of-sight from an image of an eyeball, and the AI may be trained using training data including images of an eyeball and an angle at which the eyeball in the images actually gazes. The AI program may be provided in either a display device or a photoelectric conversion device, or may be provided in an external device. When the external device has the AI program, the AI program may be transmitted from a server or the like to a display device via communication.

When the display control is performed based on the line-of-sight detection, the present embodiment can be preferably applied to a smart glasses which further includes a photoelectric conversion device for capturing an image of the outside. The smart glasses can display captured external information in real time.

Other Embodiments

The present disclosure is not limited to the above embodiment, and various modifications are possible. For example, an example in which some of the configurations of any of the embodiments are added to other embodiments or an example in which some of the configurations of any of the embodiments are replaced with some of the configurations of other embodiments is also an embodiment of the present disclosure.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation to encompass all such modifications and equivalent structures and functions.

This application claims the benefit of Japanese Patent Application No. 2022-092372, filed on Jun. 7, 2022, which is hereby incorporated by reference herein in its entirety.

What is claimed is:

1. A photoelectric conversion device comprising:
a pixel isolation portion arranged between adjacent pixels in a plurality of pixels formed in a semiconductor layer; and
a concavo-convex structure formed on a light receiving surface of the semiconductor layer,
wherein the concavo-convex structure includes a trench extending toward an oblique direction from the light receiving surface to an inside of the semiconductor layer, and
wherein the trench is filled with material that is different from material of the semiconductor layer positioned around the trench.

2. The photoelectric conversion device according to claim 1,
wherein the trench includes an annular portion having a circular shape in a cross section parallel to the light receiving surface, and
wherein a diameter of the annular portion becomes greater with depth from the light receiving surface.

3. The photoelectric conversion device according to claim 2, wherein a width of the annular portion is constant regardless of depths from the light receiving surface to the annular portion.

4. The photoelectric conversion device according to claim 2, wherein a width of the annular portion becomes narrower with depth from the light receiving surface to the annular portion.

5. The photoelectric conversion device according to claim 1, wherein the trench includes an opening having a circular shape in a plan view of the light receiving surface.

6. The photoelectric conversion device according to claim 5, wherein the multiple openings are arranged in:
row and column directions in parallel in the plan view of the light receiving surface; or
a row direction or a column direction with a houndstooth shape in a staggered manner in the plan view of the light receiving surface.

7. The photoelectric conversion device according to claim 1,
wherein the trench includes:
an opening on the light receiving surface;
a bottom facing the opening; and
an intermediate portion between the opening and the bottom,
wherein the intermediate portion has a shape corresponding to a shape of the opening.

8. The photoelectric conversion device according to claim 7, wherein the opening has a rectangular or circular shape in a plan view of the light receiving surface.

9. The photoelectric conversion device according to claim 7, wherein the openings are arranged in a latticework form in a plan view of the light receiving surface.

10. The photoelectric conversion device according to claim 7, wherein the trenches share the opening.

11. The photoelectric conversion device according to claim 7, wherein the intermediate portions separate farther from each other with depth of the light receiving surface.

12. The photoelectric conversion device according to claim 7, wherein the openings are arranged in:

row and column directions in parallel in a plan view of the light receiving surface; or a row direction or a column direction with a houndstooth shape in a staggered manner in a plan view of the light receiving surface.

13. The photoelectric conversion device according to claim 1, wherein the trench is formed in the semiconductor layer.

14. The photoelectric conversion device according to claim 1, wherein the trench is formed in an insulating layer of the semiconductor layer.

15. The photoelectric conversion device according to claim 1, wherein the trench is partially filled to include a void.

16. The photoelectric conversion device according to claim 1, wherein the photoelectric conversion device is a back-illuminated type.

17. The photoelectric conversion device according to claim 1, wherein the photoelectric conversion device is a single-photon avalanche diode (SPAD) type.

18. An imaging system comprising:

an imaging device including the photoelectric conversion device according to claim 1; and a signal processing circuit configured to process imaging data output from the imaging device.

19. A movable body comprising:

the photoelectric conversion device according to claim 1;

a distance information acquisition circuit configured to acquire distance information to an object from a signal output from the photoelectric conversion device; and a control circuit configured to control the movable body based on the distance information.

20. A photoelectric conversion device comprising:

a pixel isolation portion arranged between adjacent pixels in a plurality of pixels formed in a semiconductor layer; and a concavo-convex structure formed on a light receiving surface of the semiconductor layer, wherein the concavo-convex structure includes a trench extending toward an oblique direction from the light receiving surface to an inside of the semiconductor layer, and wherein the trench is filled with material that has a refractive index different from a refractive index of the semiconductor layer positioned around the trench.

\* \* \* \* \*